US012744179B2

(12) United States Patent
Asakura et al.

(10) Patent No.: US 12,744,179 B2
(45) Date of Patent: Sep. 22, 2026

(54) SAMPLE HOLDER AND ANALYSIS SYSTEM

(71) Applicant: Hitachi High-Tech Corporation, Tokyo (JP)

(72) Inventors: Hiroyuki Asakura, Tokyo (JP); Hideki Kikuchi, Tokyo (JP); Toshie Yaguchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 419 days.

(21) Appl. No.: 18/561,202

(22) PCT Filed: May 17, 2021

(86) PCT No.: PCT/JP2021/018607
§ 371 (c)(1),
(2) Date: Nov. 15, 2023

(87) PCT Pub. No.: WO2022/244055
PCT Pub. Date: Nov. 24, 2022

(65) Prior Publication Data

US 2024/0266141 A1 Aug. 8, 2024

(51) Int. Cl.
*H01J 37/20* (2006.01)
*H01J 37/26* (2006.01)

(52) U.S. Cl.
CPC ............... *H01J 37/20* (2013.01); *H01J 37/26* (2013.01); *H01J 2237/20214* (2013.01)

(58) Field of Classification Search
CPC .. H01J 37/20; H01J 37/26; H01J 2237/20214; H01J 2237/2007;

(Continued)

(56) References Cited

U.S. PATENT DOCUMENTS

2012/0212583 A1 8/2012 Yaguchi et al.

FOREIGN PATENT DOCUMENTS

JP 4654216 B2 3/2011
JP 2011-90973 A 5/2011

(Continued)

OTHER PUBLICATIONS

International Search Report (PCT/ISA/210) issued in PCT Application No. PCT/JP2021/018607 dated Aug. 10, 2021 with English translation (8 pages).

(Continued)

*Primary Examiner* — Michael Maskell
(74) *Attorney, Agent, or Firm* — Crowell & Moring LLP

(57) ABSTRACT

A sample holder with high versatility is provided. A sample holder 100 includes a holder shaft 2, a placement unit 3 on which a sample SAM is placeable, a moving mechanism 4 that moves the holder shaft in a first direction, rotating mechanism 5 that rotates the holder shaft 2 in a first rotation direction with a center of the holder shaft 2 as a rotation axis, a protrusion unit 6 that is fixed to the holder shaft 2 so as to protrude in a second direction intersecting the first direction and whose position is changed according to the rotation and movement of the holder shaft 2, and a guide unit 7 that surrounds an outer periphery of the holder shaft 2 and whose position is not changed according to the rotation and movement of the holder shaft 2. The guide unit 7 is provided with a through hole (7*a*) and a through hole (7*b*). A width of the through hole (7*a*) in the first rotation direction is larger than a width of the through hole (7*b*) in the first rotation direction. The protrusion unit 6 is movable inside the through hole (7*a*) and inside the through hole (7*b*).

5 Claims, 25 Drawing Sheets

(58) Field of Classification Search
CPC ........... H01J 2237/202; H01J 2237/204; H01J 2237/31745; H01J 2237/31749; Y02E 60/10
USPC .................... 250/306, 307, 310, 311, 440.11
See application file for complete search history.

(56) References Cited

FOREIGN PATENT DOCUMENTS

| | | | | | |
|---|---|---|---|---|---|
| JP | 2014-89936 | A | | 5/2014 | |
| JP | 2014089936 | A | * | 5/2014 | ............. H01J 37/18 |
| JP | 5517559 | B2 | | 6/2014 | |
| JP | 2015-18645 | A | | 1/2015 | |
| JP | 2016-100119 | A | | 5/2016 | |

OTHER PUBLICATIONS

Japanese-language Written Opinion (PCT/ISA/237) issued in PCT Application No. PCT/JP2021/018607 dated Aug. 10, 2021 with English translation (10 pages).

* cited by examiner

[FIG. 1]
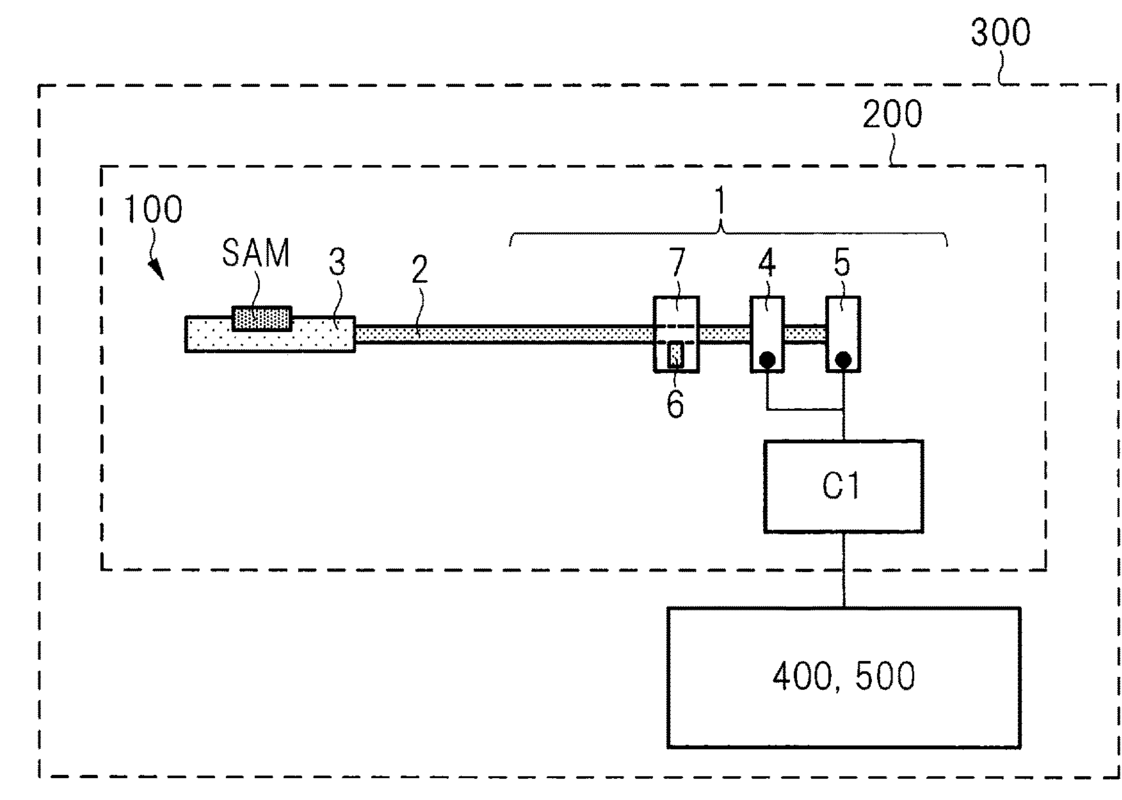
[FIG. 2]
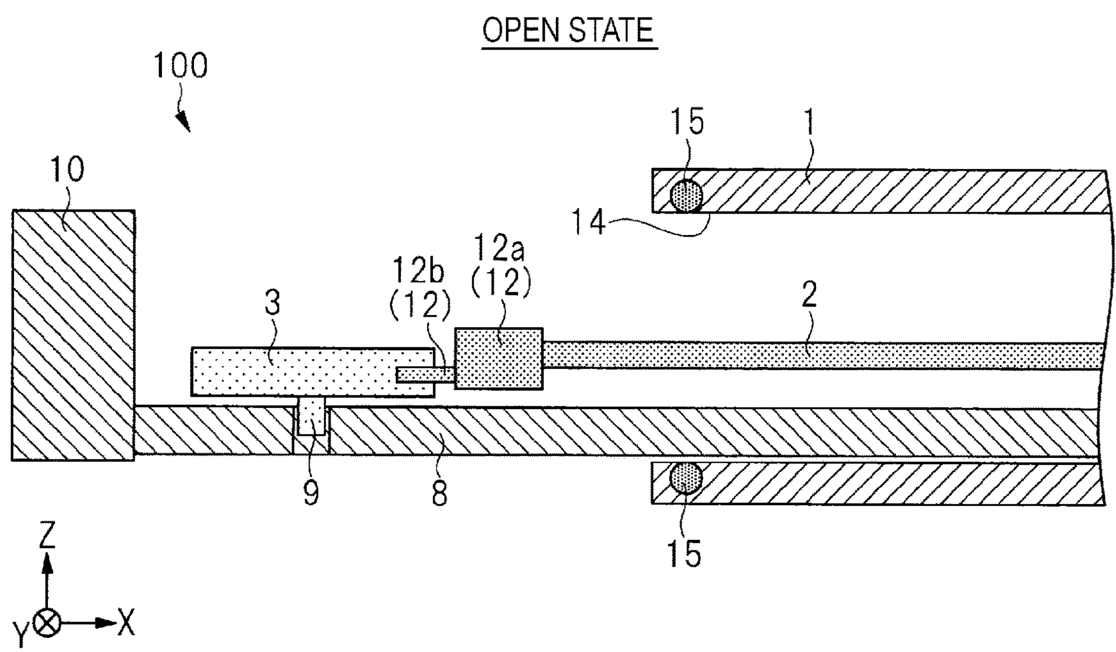

[FIG. 3]
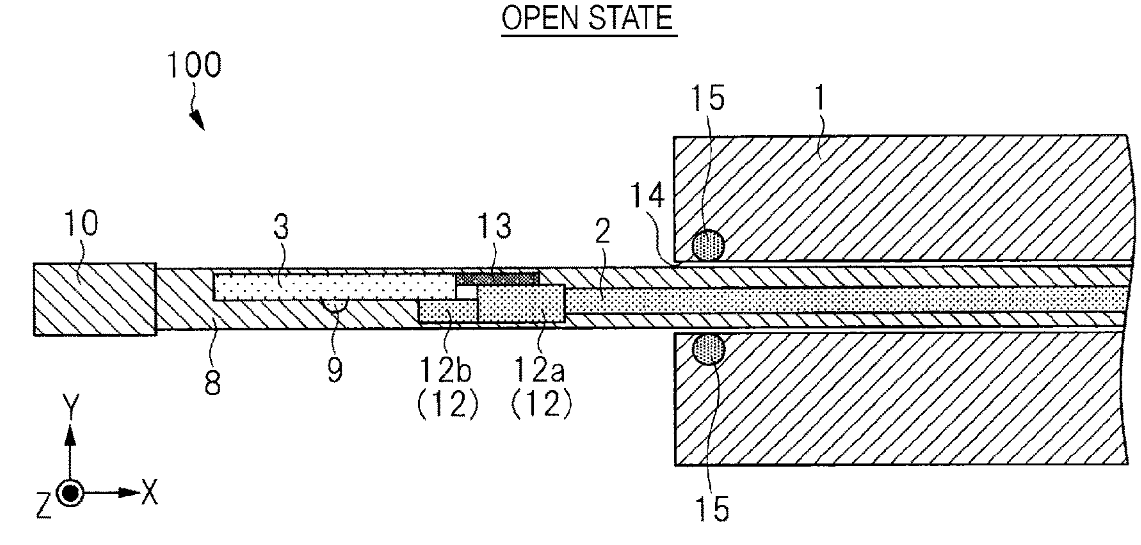
[FIG. 4]
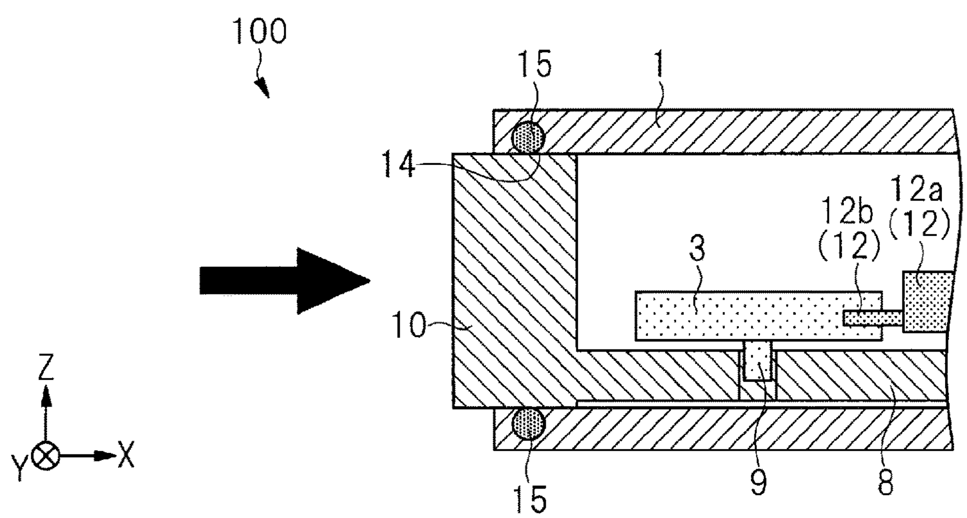

[FIG. 5A]
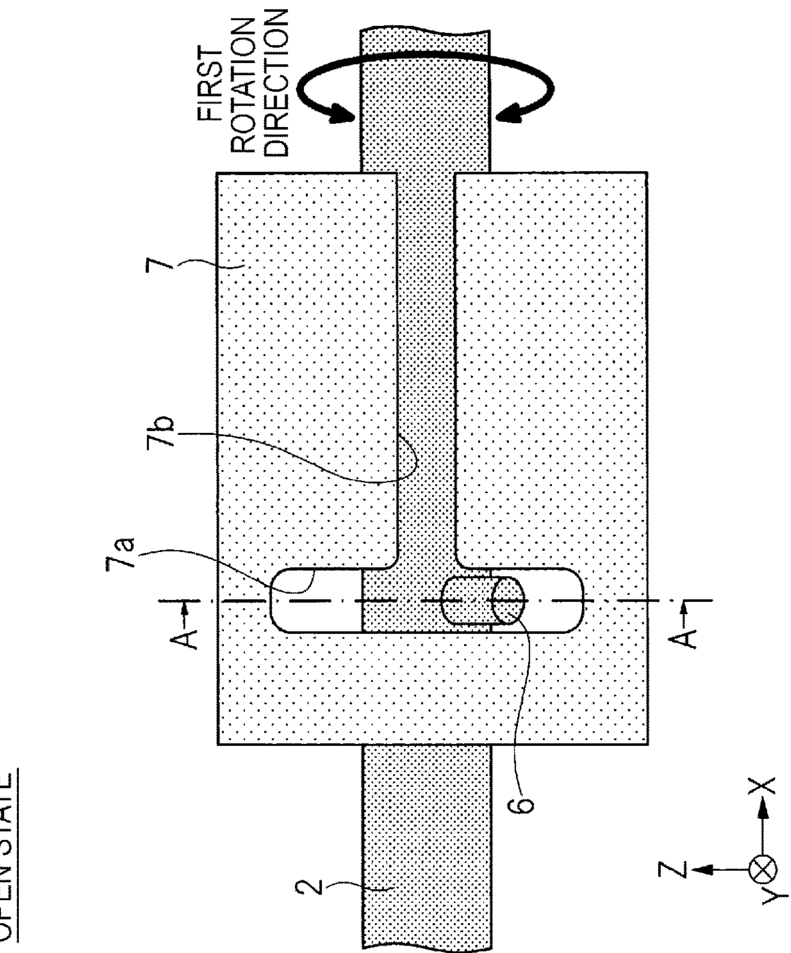
A-A CROSS-SECTION
7a
6
2
7
Z
X
Y

[FIG. 5B]
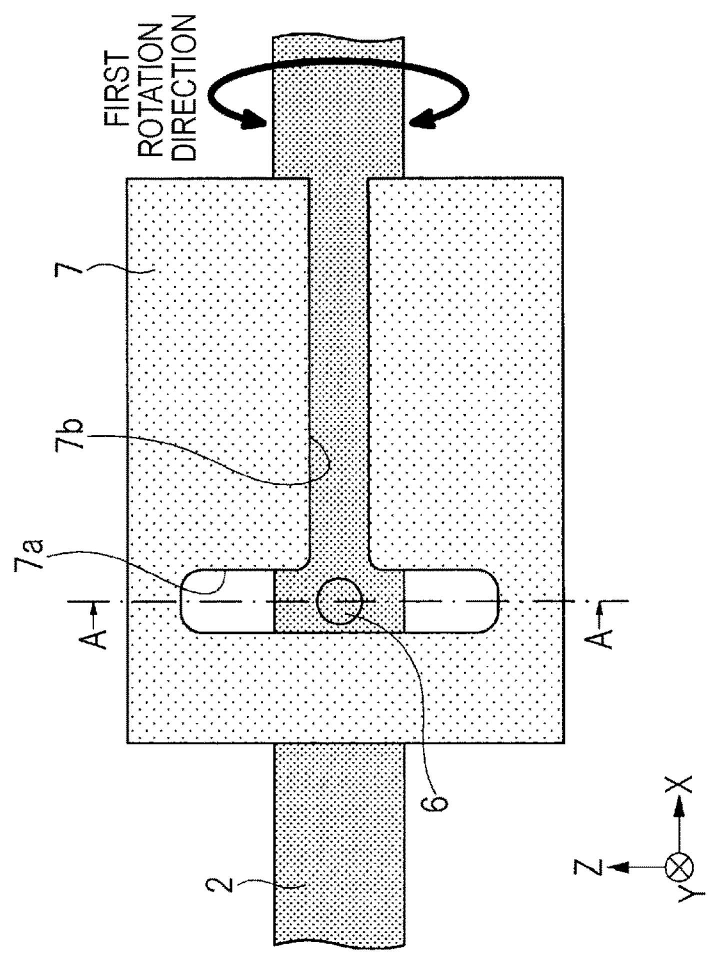
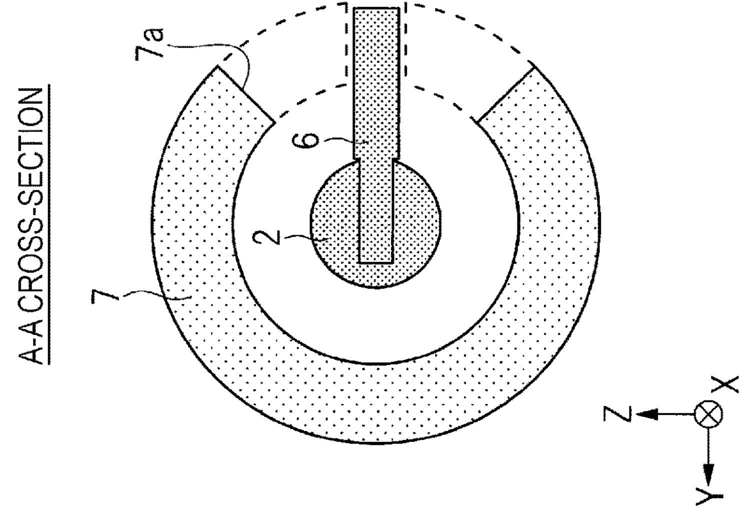

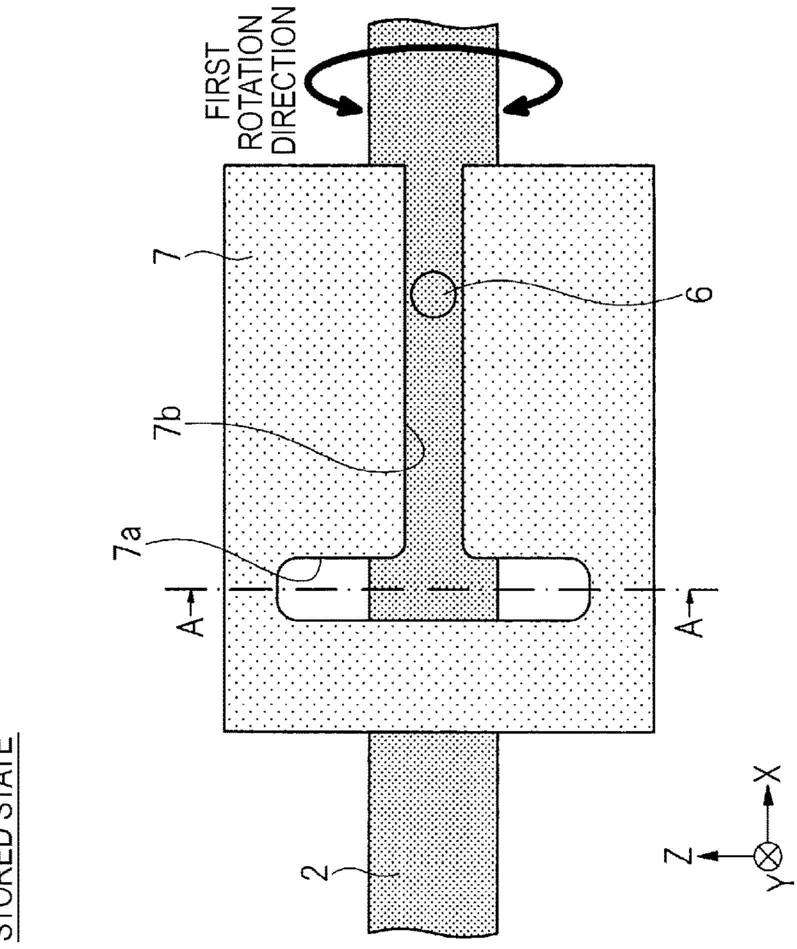
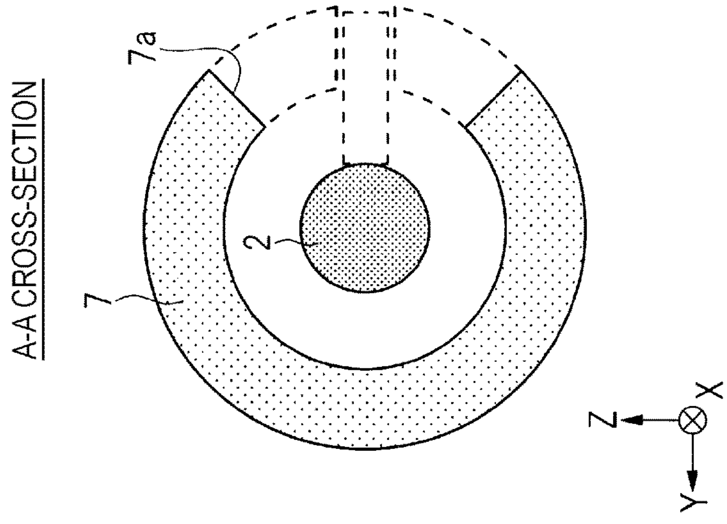
[FIG. 5C]

[FIG. 6]
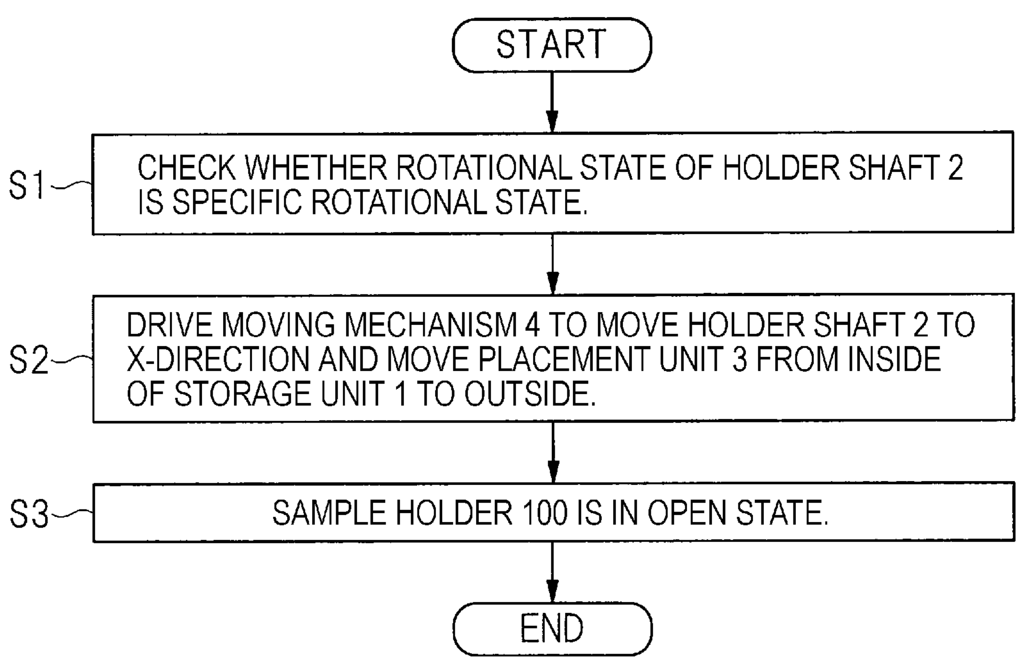
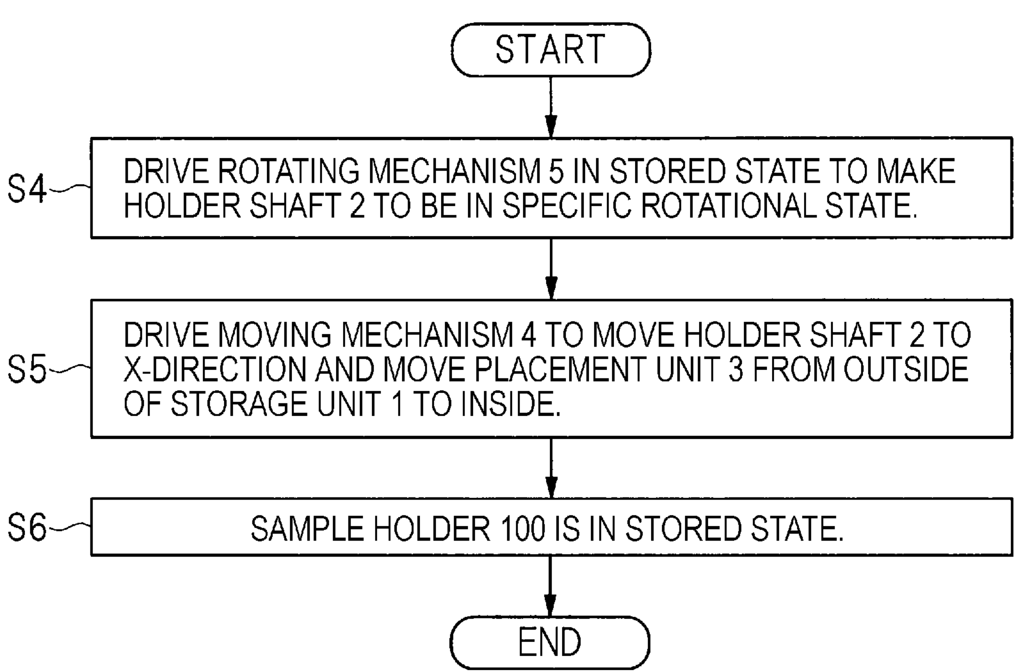

B-B CROSS-SECTION

3c

3b

3a

3d

3

X

Y

Z

B-B CROSS-SECTION

FIG. 12

B-B CROSS-SECTION

[FIG. 13A]
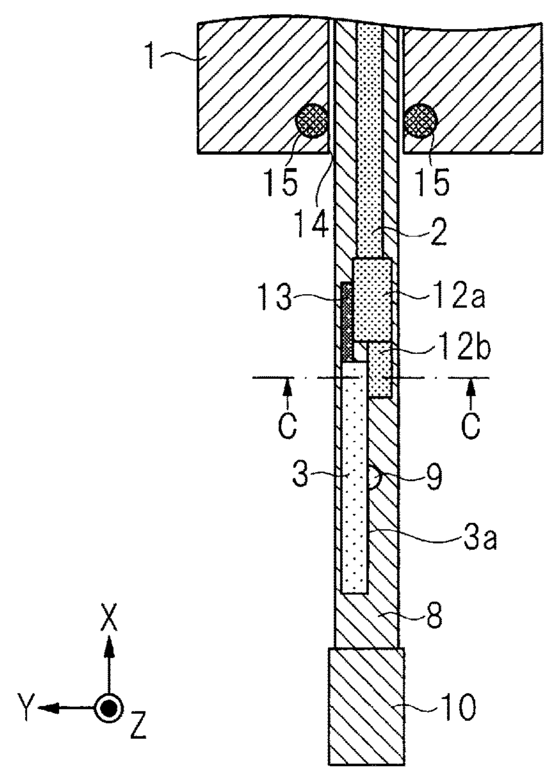
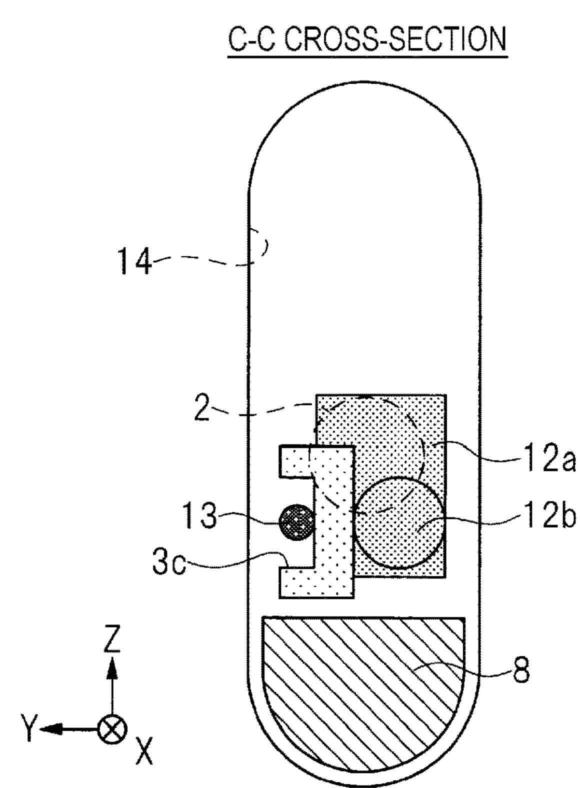

[FIG. 13B]
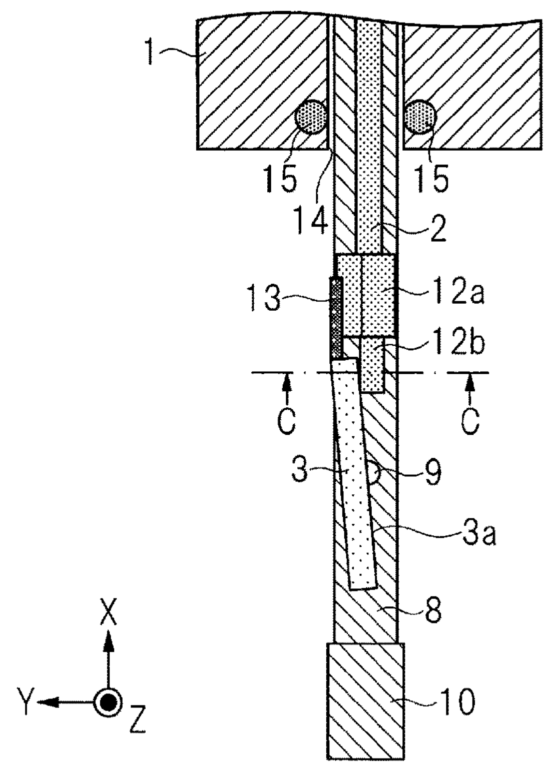
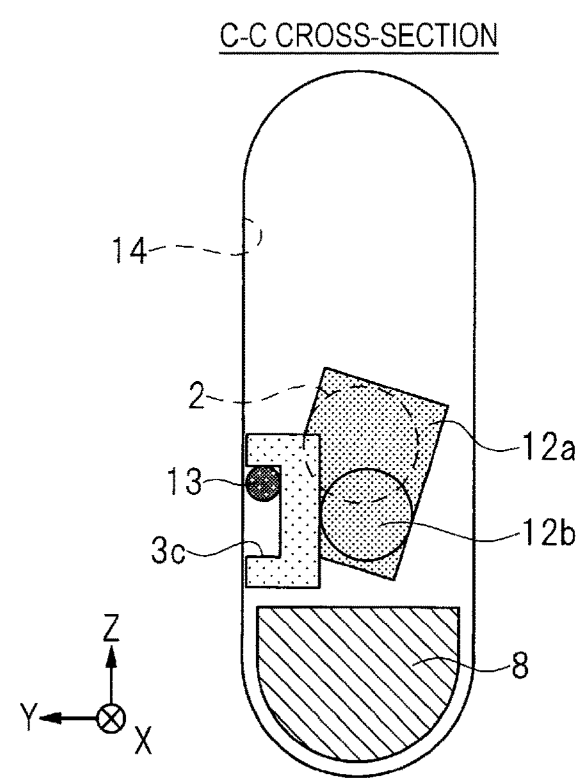

[FIG. 13C]
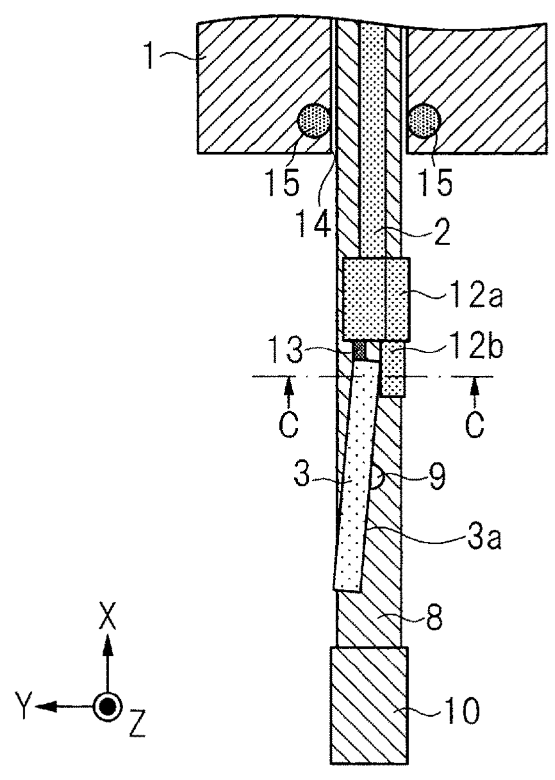
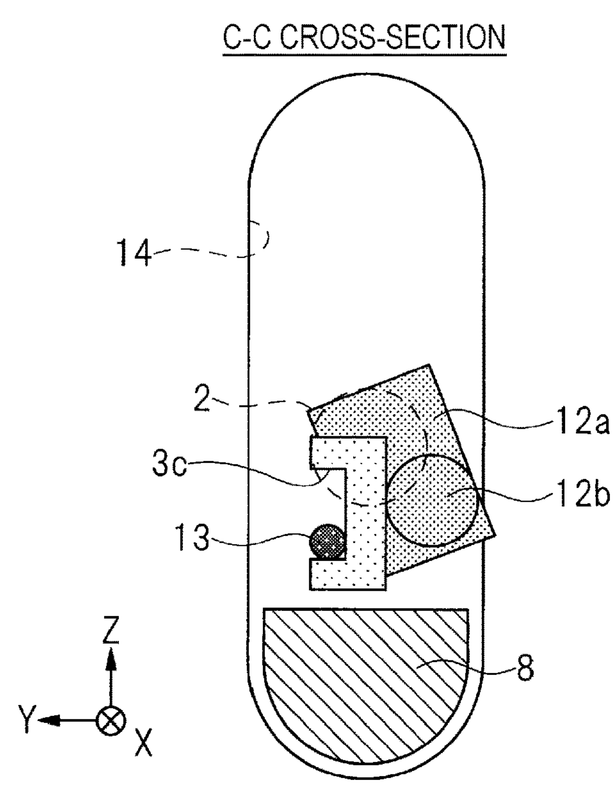

[FIG. 14]
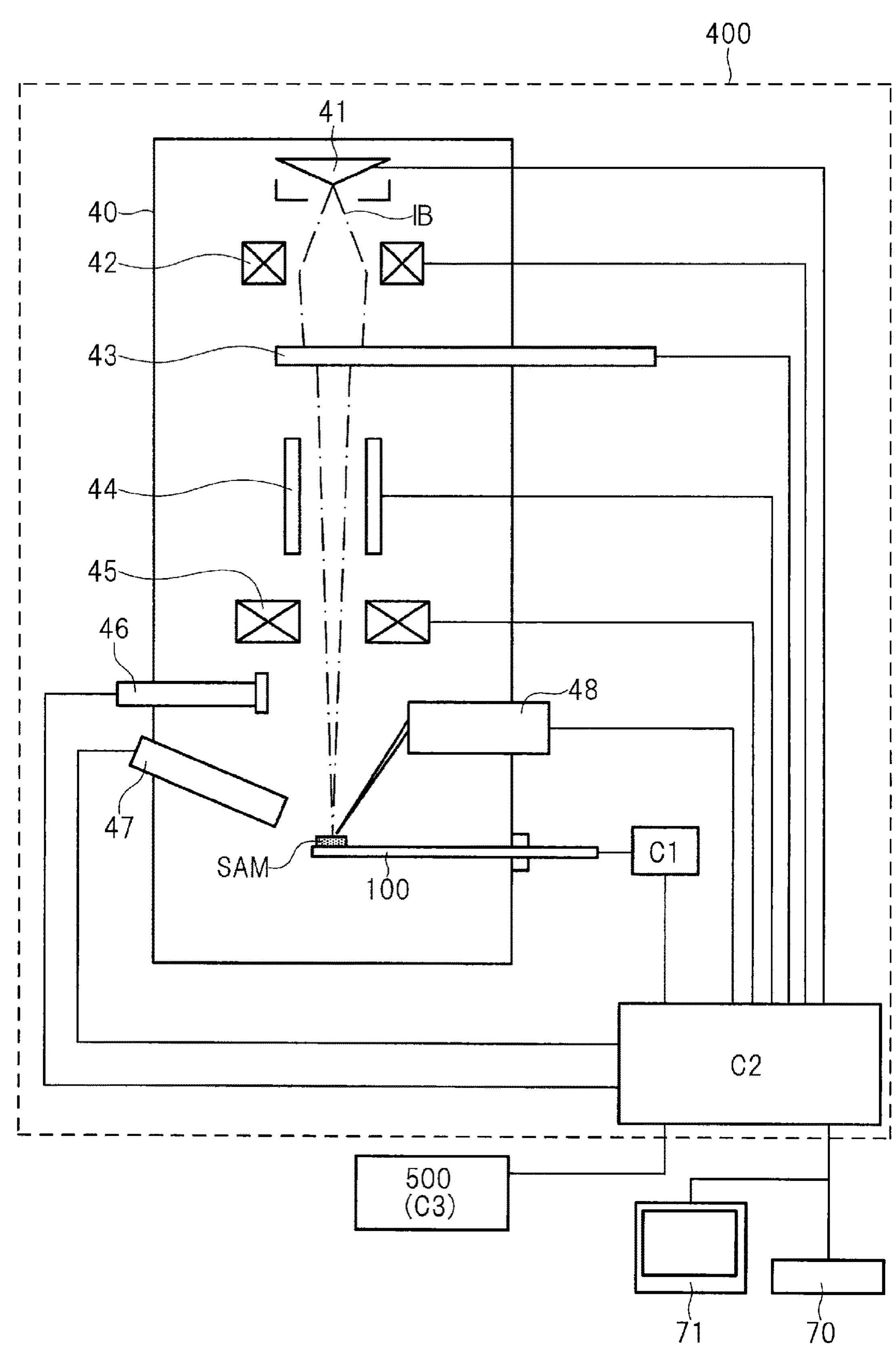

[FIG. 15]
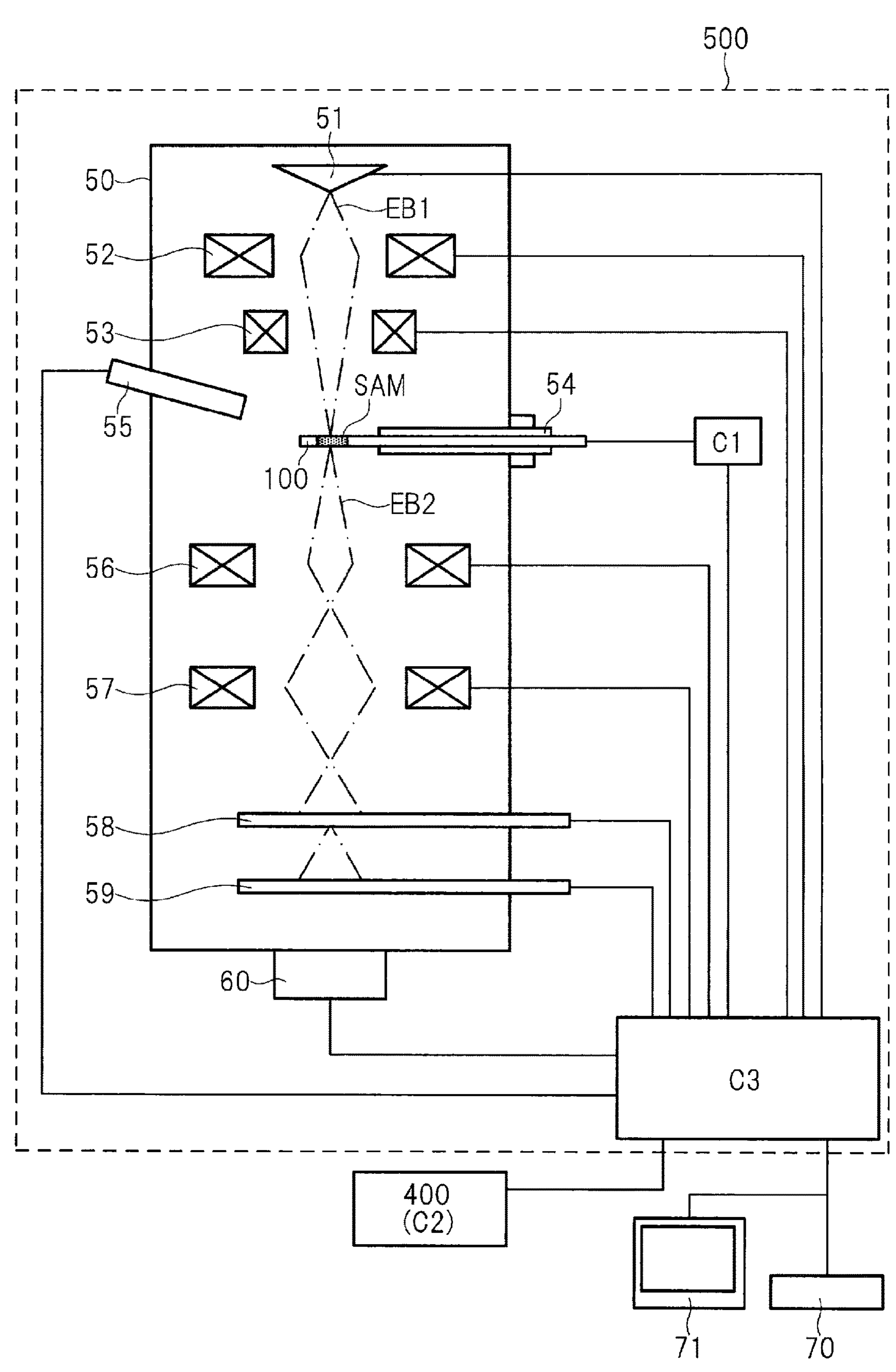

[FIG. 16]
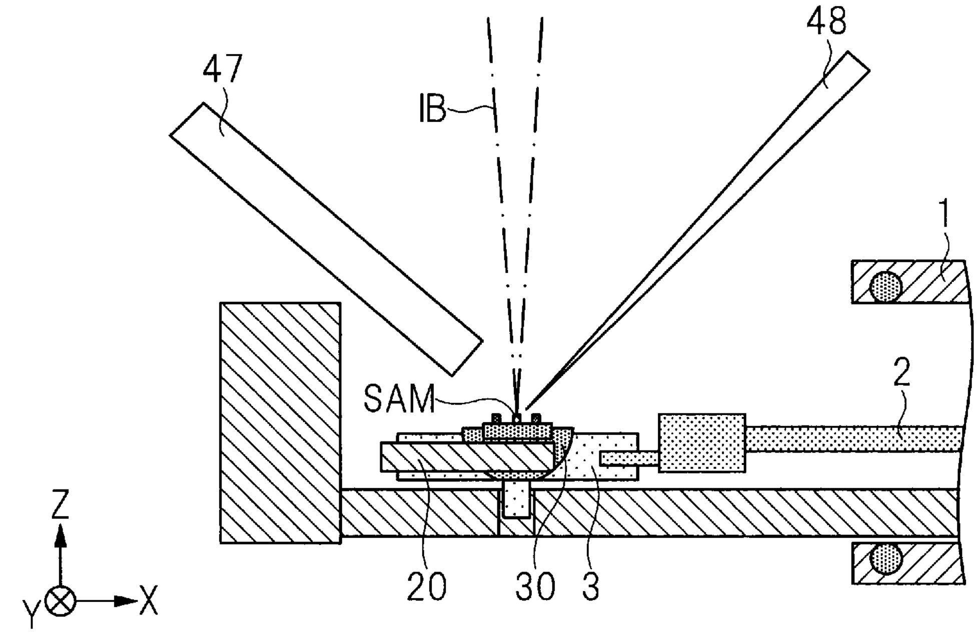
[FIG. 17]
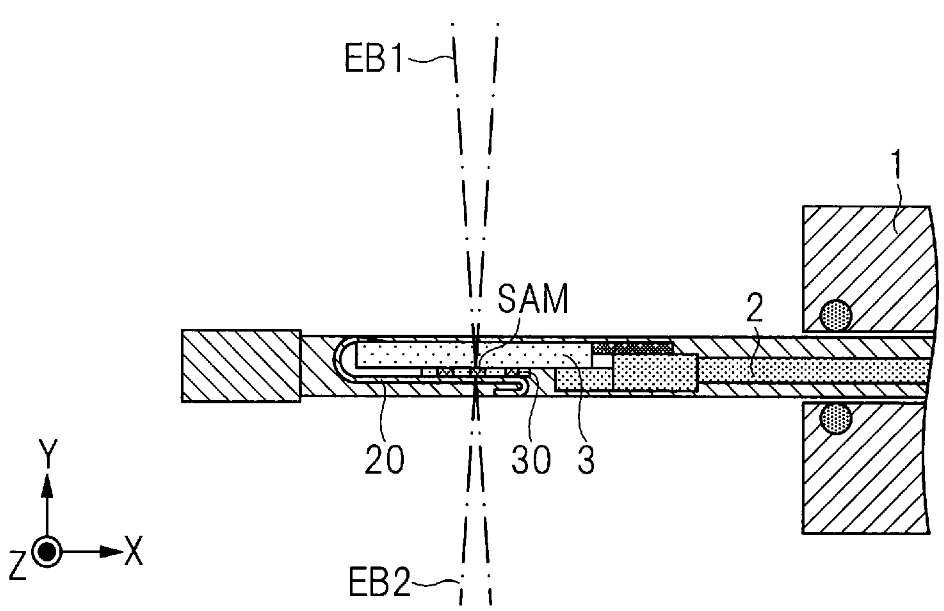

[FIG. 18]
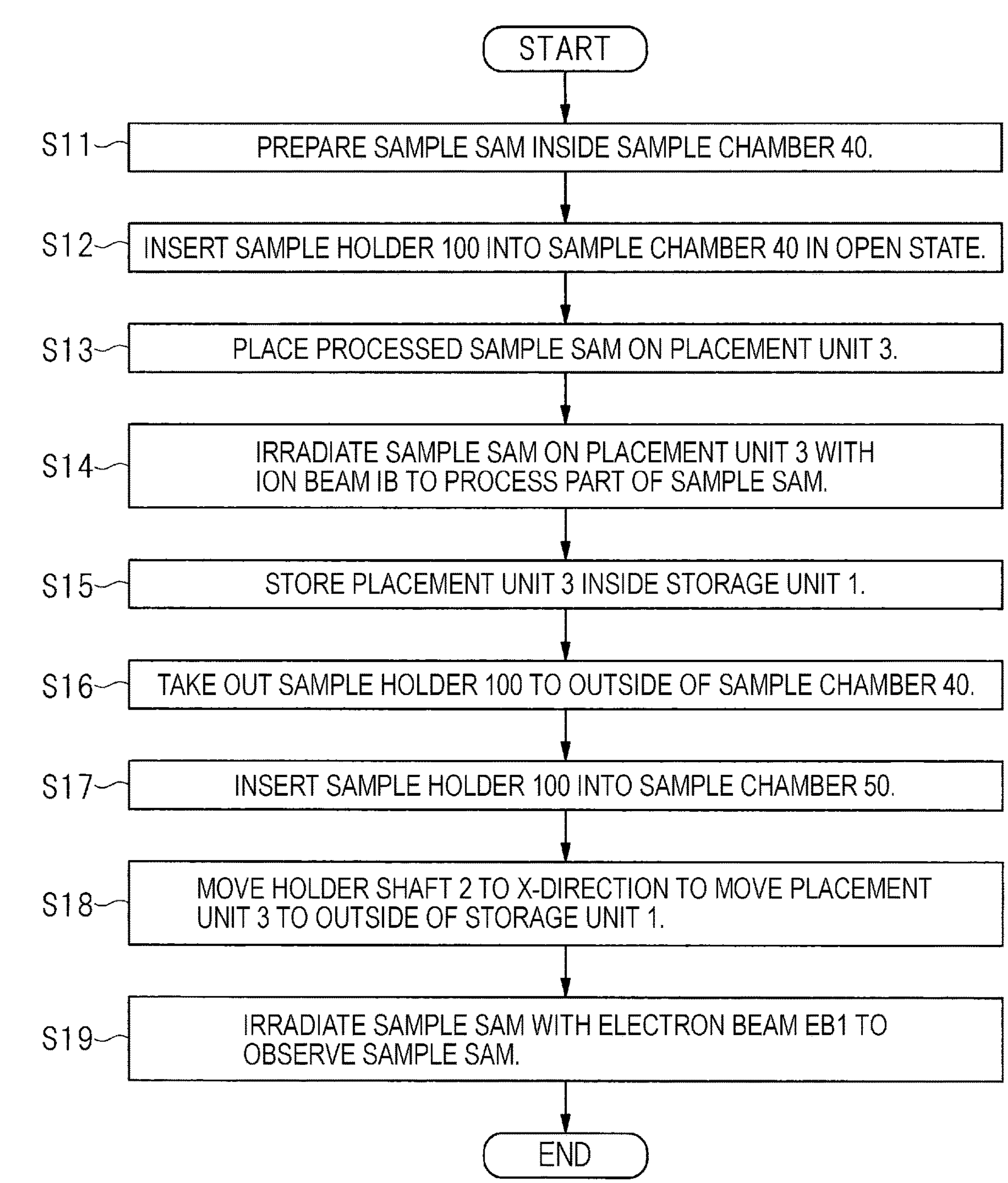

[FIG. 19]
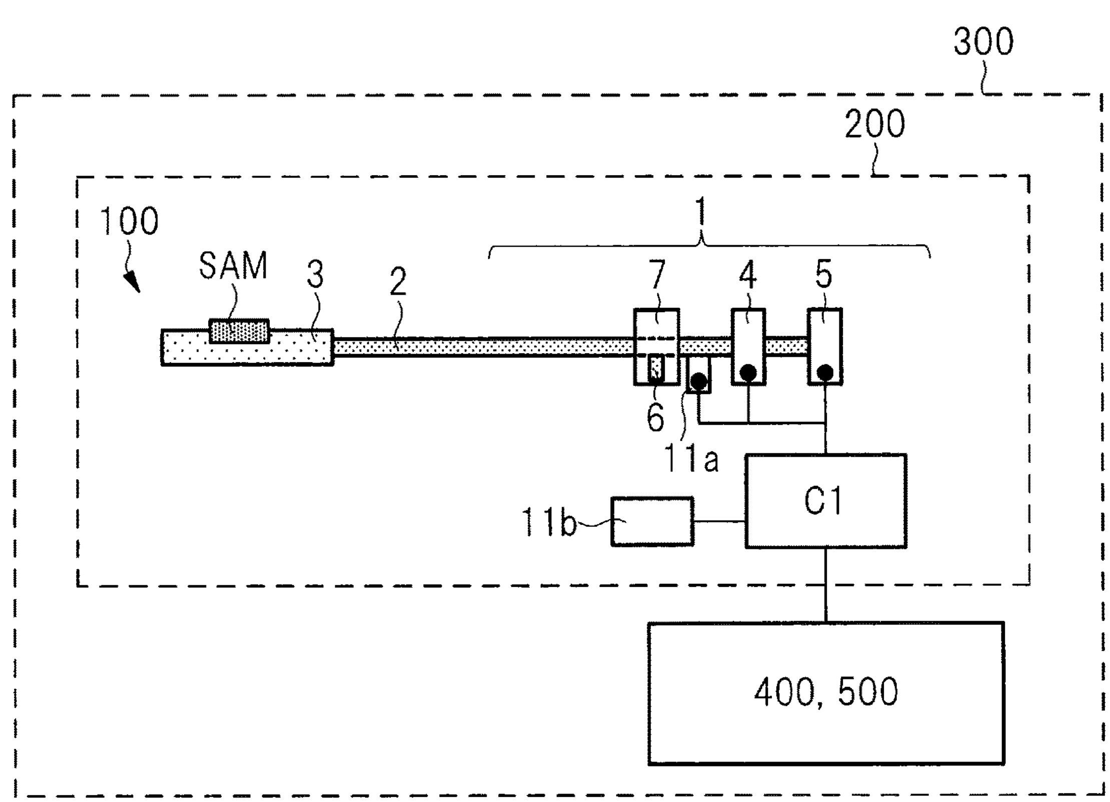

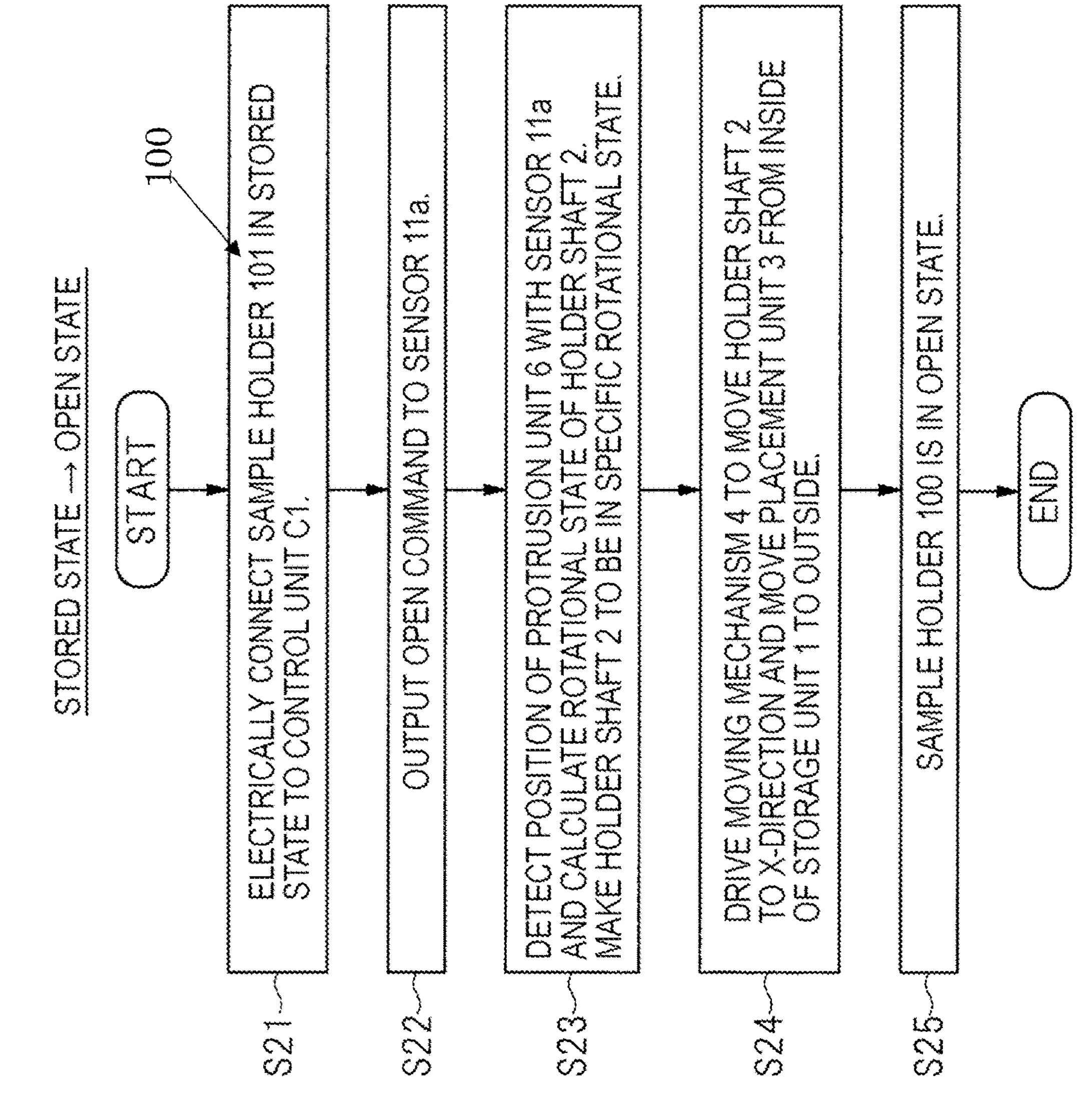
FIG. 20
STORED STATE → OPEN STATE
START
100
S21
ELECTRICALLY CONNECT SAMPLE HOLDER 101 IN STORED STATE TO CONTROL UNIT C1.
S22
OUTPUT OPEN COMMAND TO SENSOR 11a.
S23
DETECT POSITION OF PROTRUSION UNIT 6 WITH SENSOR 11a AND CALCULATE ROTATIONAL STATE OF HOLDER SHAFT 2. MAKE HOLDER SHAFT 2 TO BE IN SPECIFIC ROTATIONAL STATE.
S24
DRIVE MOVING MECHANISM 4 TO MOVE HOLDER SHAFT 2 TO X-DIRECTION AND MOVE PLACEMENT UNIT 3 FROM INSIDE OF STORAGE UNIT 1 TO OUTSIDE.
S25
SAMPLE HOLDER 100 IS IN OPEN STATE.
END

[FIG. 22A]
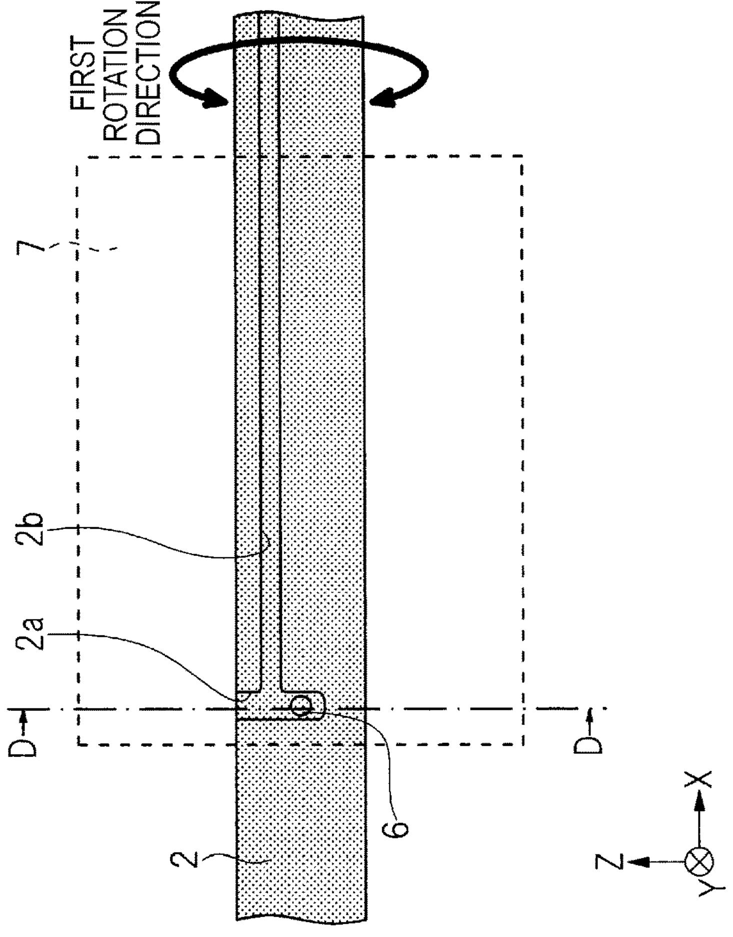
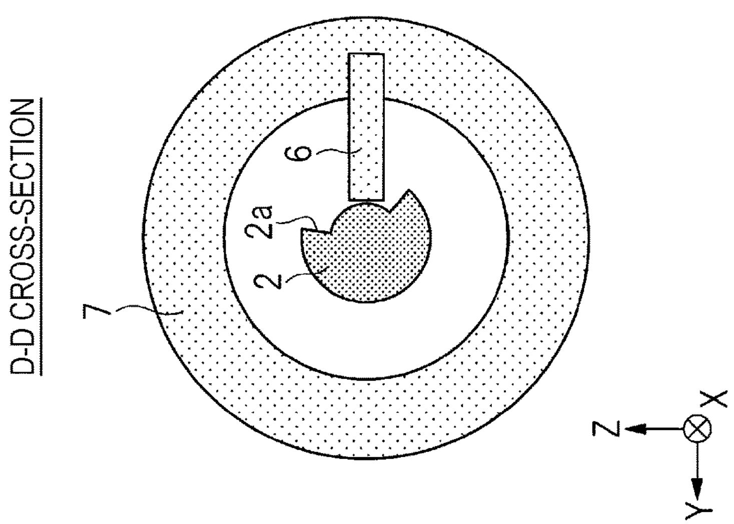

[FIG. 22B]
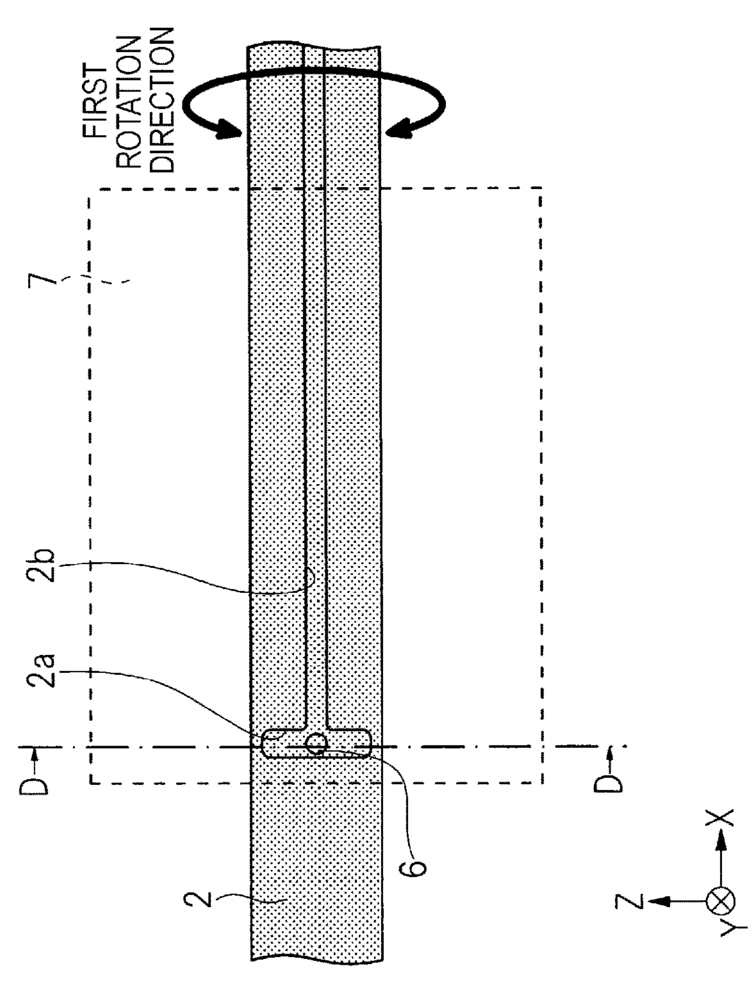
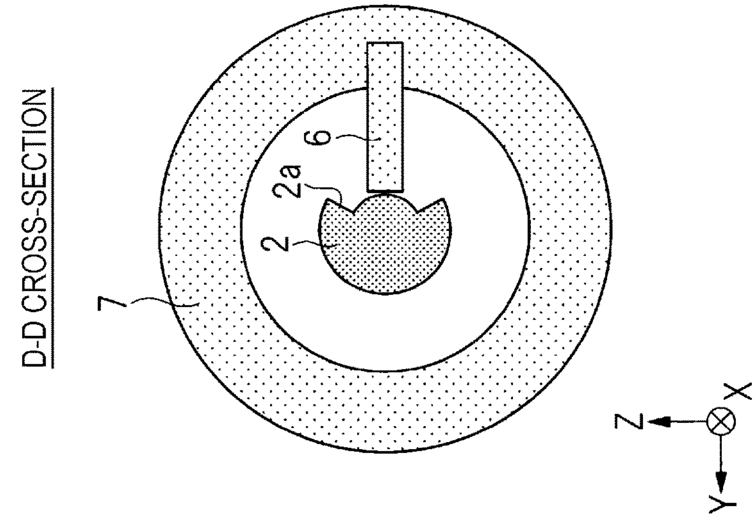

[FIG. 22C]
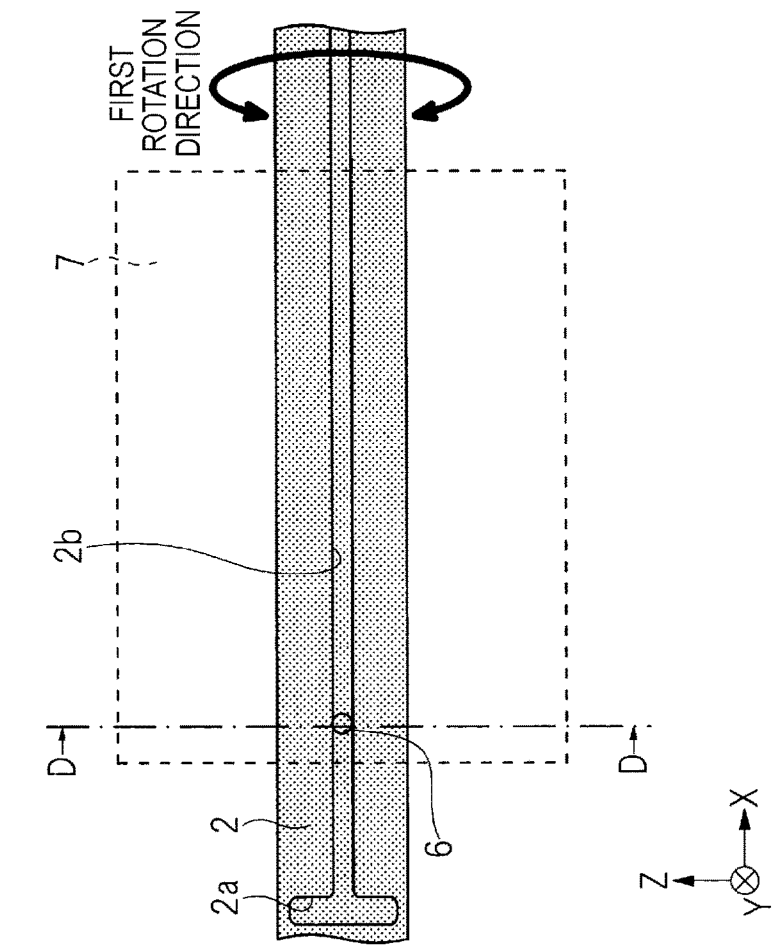
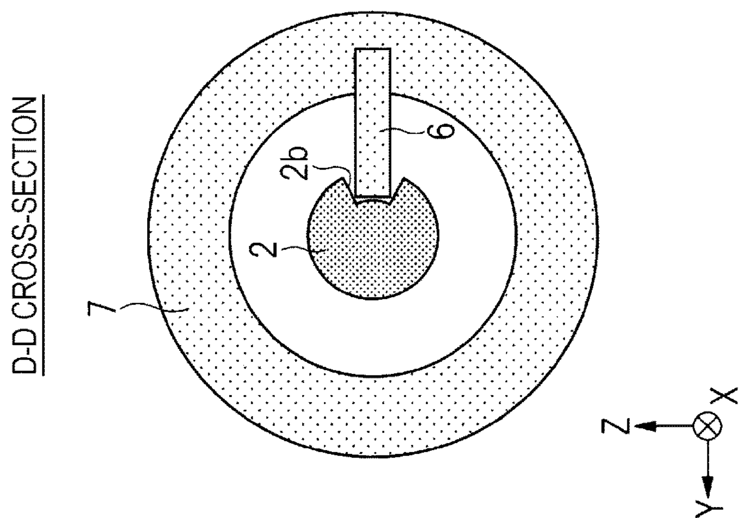

SAMPLE HOLDER AND ANALYSIS SYSTEM

TECHNICAL FIELD

The present invention relates to a sample holder and an analysis system, and in particular, to a sample holder including a placement unit on which a sample can be placed at a distal end of a holder shaft, and an analysis system including the sample holder.

BACKGROUND ART

In the field of material development, the importance of the observation of a crystalline structure of a sample is increasing. In recent years, particularly in the field of organic EL devices or lithium ion batteries, which are environmental energy materials, there is a growing need to observe the crystalline structure of the sample while avoiding reactions with atmospheric components. For example, a sample preparation device such as a focused ion beam (FIB) device or a focused ion beam-scanning electron microscope (FIB-SEM) device prepares a sample for observing the crystalline structure, and the sample observation is performed using a sample observation device such as a transmission electron microscope (TEM).

For example, PTL 1 discloses a function of achieving the preparation of the sample by FIB processing and the observation of the sample by TEM with a single sample holder, without changing the sample. In PTL 1, by transmitting a rotation of a holder shaft by a gear mechanism, the sample can be rotated 360 degrees around any axis rotation (Azimuth axis) perpendicular to an extending direction of the holder shaft.

Further, PTL 2 discloses a technique that stores a distal end of a support rod inside a sample holder by using a mechanism for sliding the support rod, to form an airtight chamber in the vicinity of a sample stage. According to this, the FIB processing and TEM observation can be achieved with a single sample holder without changing the sample and without exposing the sample to the atmosphere.

CITATION LIST

Patent Literature

PTL 1: JP4654216B
PTL 2: JP5517559B

SUMMARY OF INVENTION

Technical Problem

In PTLs 1 and 2, although it is assumed that the sample has a needle shape, it is not assumed to place a mesh or half mesh having a diameter of 3 mm, which is commonly used in the FIB processing and TEM observation, on the sample holder. Therefore, preparation of samples with special shapes, the use of special purpose meshes such as tomography, or the use of specific meshes are assumed. At this time, when an attempt is made to place a large sample containing a normal size mesh on a single sample holder, narrowness of a pole piece gap where a distal end of the sample holder is inserted becomes a problem in the TEM observation.

In PTL 2, although a cylindrical-shaped storage unit is provided, even in an attempt to place a mesh having a diameter of 3 mm on the sample holder, a diameter of the storage unit exceeds at least 3 mm. Therefore, in the TEM observation, for example, the sample holder cannot be inserted into the pole piece gap of 3 mm or less.

A pole piece gap distance is determined by the magnetic field lens and optics design. Though the shortening of the pole piece gap distance is alleviated by the improvement of aberration correction technology, the shortening of the pole piece gap distance is inevitable as the performance of the TEM improves in the future. Therefore, the problem of placing a large sample on the sample holder, and, whether to perform an operation according to the application may continue to occur in the future.

Therefore, in order to achieve a sample holder on which a large sample including a mesh can be placed and on which processes from the FIB processing to the TEM observation can be performed in a single operation, a portion where the sample is placed is required to have a thin flat plate shape in a pole piece gap direction, that is, a direction along an optical axis. Similarly, members that configure a periphery of a sample placement unit are also required to have a thin flat plate shape in the direction along the optical axis.

Further, the commonly used sample holder can be rotated in two directions: a rotation direction (Tilt rotation direction) with an extending direction of the holder shaft as a rotation axis (Tilt axis), and a rotation direction (Azimuth rotation direction) with a direction intersecting the holder shaft as a rotation axis (Azimuth axis).

In PTL 2, regardless of the state in which the sample is rotated in the Azimuth rotation direction (tilted state of the sample), a storage operation of the sample can be performed. In PTL 2, all of the components, including a sample of the needle shape, are contained inside the cylinder, no part of the sample is outside the cylinder in a specific rotational state. That is, it is possible to store the sample in the storage unit in any rotational state.

Here, assuming a sample holder that can be used more universally in the FIB processing and the TEM observation, it is desirable to be a sample holder on which a mesh having a diameter of 3 mm can be placed without using a special sample shape or a special purpose mesh. At this time, when the sample placement unit having a flat plate shape performs the storage operation while tilted in the Azimuth rotation direction, the situation where the placement unit interferes with the storage unit occurs. Accordingly, it is necessary to provide a structure that allows the placement unit to be rotated in the Azimuth rotation direction (that is, the placement unit can be tilted) and to prevent the placement unit from interfering with the storage unit during the storage operation of the sample.

A main object of the present application is to provide a highly versatile sample holder that can be shared between the sample preparation device such as an FIB device or an FIB-SEM device and the sample observation device such as a TEM. To this end, provided is a technique that can rotate the placement unit having a flat plate shape on which a large sample or a mesh on which a sample is mounted can be placed in the Tilt rotation direction and Azimuth rotation direction. Further, provided is a technique that can store the placement unit inside the storage unit so that the placement unit does not interfere with the storage unit. Further, provided is a technique that can be used in the sample preparation device and the sample observation device by maintaining the airtightness of the inside of the storage unit, without exposing the sample to the atmosphere.

Other problems and novel features will be apparent from the description and accompanying drawings in the present specification.

Solution to Problem

Among the embodiments disclosed in the present application, a brief outline of representative embodiments is as follows.

A sample holder in one embodiment is used in a charged particle beam device. Further, the sample holder includes a holder shaft that extends in a first direction, a placement unit that is provided at a distal end of the holder shaft and on which a sample is placeable, a moving mechanism that moves the holder shaft in the first direction, a rotating mechanism that rotates the holder shaft in a first rotation direction with a center of the holder shaft in a cross-sectional view perpendicular to the first direction as a rotation axis, a protrusion unit that is fixed to the holder shaft so as to protrude in a second direction intersecting the first direction and whose position is changed according to the rotation and movement of the holder shaft, and a guide unit that surrounds an outer periphery of the holder shaft in the first rotation direction and whose position is not changed according to the rotation and movement of the holder shaft. Here, the guide unit is provided with a first through hole and a second through hole communicating with the first through hole, a width of the first through hole in the first rotation direction is larger than a width of the second through hole in the first rotation direction, and the protrusion unit is movable inside the first through hole and inside the second through hole.

A sample holder in one embodiment is used in a charged particle beam device. Further, the sample holder includes a holder shaft that extends in a first direction, a placement unit that is provided at a distal end of the holder shaft and has a first plane in which a sample is placed, a moving mechanism that moves the holder shaft in the first direction, a rotating mechanism that rotates the holder shaft in a first rotation direction with a center of the holder shaft in a cross-sectional view perpendicular to the first direction as a rotation axis, and a rotary shaft member that extends in a third direction intersecting the first direction and is fixed to the placement unit. Here, the placement unit is provided at the distal end of the holder shaft via a transmission member, the distal end of the holder shaft is provided with an elastic member so as to press the placement unit against the transmission member, the transmission member includes a connection unit fixed to the distal end of the holder shaft and a transmission unit extending in the first direction from the connection unit toward the placement unit and in contact with the first plane, a center of the transmission unit is shifted from the center of the holder shaft in a cross-sectional view perpendicular to the first direction, and the placement unit is rotatable in a second rotation direction with a center of the rotary shaft member in a cross-sectional view perpendicular to the third direction as a rotation axis.

A sample holder in one embodiment is used in a charged particle beam device. Further, the sample holder includes a holder shaft that extends in a first direction, a placement unit that is provided at a distal end of the holder shaft and on which a sample is placeable, a storage unit that includes an opening and in which the placement unit is storable, a moving mechanism that moves the holder shaft in the first direction, a rotating mechanism that rotates the holder shaft in a first rotation direction with a center of the holder shaft in a cross-sectional view perpendicular to the first direction as a rotation axis, and a support unit that extends in the first direction and is movable in the first direction in conjunction with the movement of the holder shaft by the moving mechanism. Here, the support unit is adjacent to the holder shaft and the placement unit in a third direction intersecting the first direction, a hatch cover is provided at a distal end of the support unit, the opening is closed by the hatch cover in a stored state in which the holder shaft and the support unit are moved in the first direction and the placement unit is stored inside the storage unit, and in a cross-sectional view perpendicular to the first direction, each of the opening and the hatch cover is formed in an oval shape or an elliptical shape having the third direction as a long axis.

Advantageous Effects of Invention

According to one embodiment, it is possible to provide a highly versatile sample holder.

BRIEF DESCRIPTION OF DRAWINGS

FIG. 1 is a schematic diagram illustrating a sample holder, a storage system, and an analysis system according to a first embodiment.

FIG. 2 is a cross-sectional view illustrating an open state of the sample holder according to the first embodiment.

FIG. 3 is a plan view illustrating the open state of the sample holder according to the first embodiment.

FIG. 4 is a cross-sectional view illustrating a stored state of the sample holder according to the first embodiment.

FIG. 5A is a side view and a cross-sectional view illustrating a guide unit and a protrusion unit according to the first embodiment.

FIG. 5B is a side view and a cross-sectional view illustrating the guide unit and the protrusion unit according to the first embodiment.

FIG. 5C is a side view and a cross-sectional view illustrating the guide unit and the protrusion unit according to the first embodiment.

FIG. 6 is a flowchart illustrating a switch between the open state and the stored state according to the first embodiment.

FIG. 9 is a cross-sectional view illustrating the placement unit according to the first embodiment.

FIG. 12 is a cross-sectional view illustrating the placement unit, the mesh, and the mesh holder according to the first embodiment.

FIG. 13A is a plan view and a cross-sectional view illustrating the sample holder according to the first embodiment.

FIG. 13B is a plan view and a cross-sectional view illustrating the sample holder according to the first embodiment.

FIG. 13C is a plan view and a cross-sectional view illustrating the sample holder according to the first embodiment.

FIG. 14 is a schematic diagram illustrating a sample preparation device according to the first embodiment.

FIG. 15 is a schematic diagram illustrating a sample observation device according to the first embodiment.

FIG. 16 is a cross-sectional view illustrating a state in which a sample is irradiated with an ion beam according to the first embodiment.

FIG. 17 is a cross-sectional view illustrating a state in which the sample is irradiated with an electron beam according to the first embodiment.

FIG. 18 is a flowchart illustrating a sample preparation means and a sample observation means according to the first embodiment.

FIG. 19 is a schematic diagram illustrating a sample holder, a storage system, and an analysis system according to a modification.

FIG. 20 is a flowchart illustrating a switch from a stored state to an open state according to the modification.

FIG. 22A is a side view and a cross-sectional view illustrating a holder shaft and a protrusion unit according to a second embodiment.

FIG. 22B is a side view and a cross-sectional view illustrating the holder shaft and the protrusion unit according to the second embodiment.

FIG. 22C is a side view and a cross-sectional view illustrating the holder shaft and the protrusion unit according to the second embodiment.

DESCRIPTION OF EMBODIMENTS

Figure 7:
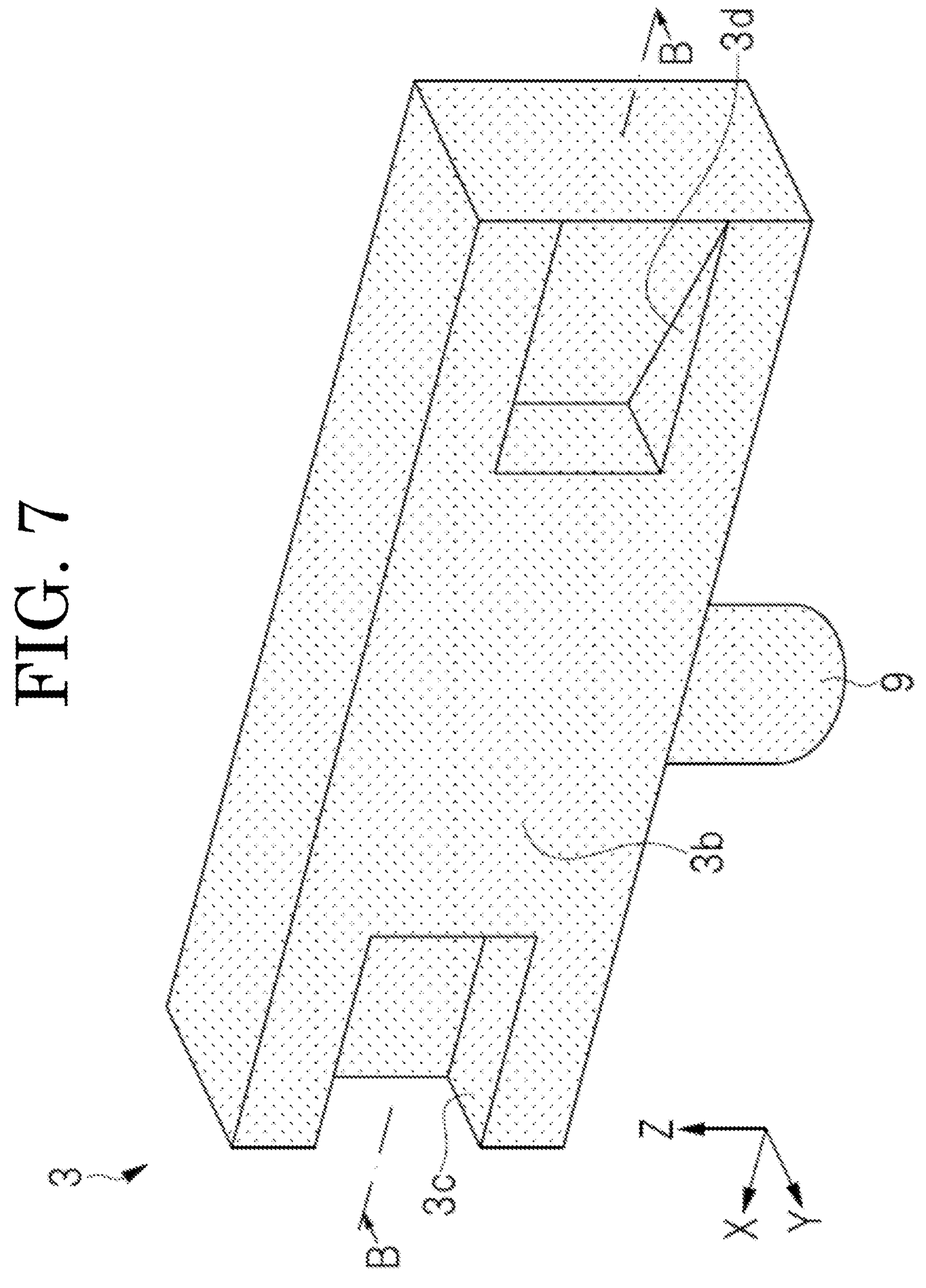
FIG. 7 is a perspective view illustrating a placement unit according to the first embodiment.

Hereinafter, embodiments will be described in detail with reference to the drawings. Incidentally, in all the drawings for illustrating the embodiment, the members having the same functions are denoted by the same reference numerals, and the repeated description thereof will be omitted. Further, the following embodiments do not repeat the description of the same or similar parts in principle except when particularly necessary.

X, Y, and Z directions described herein are used to describe the orientation of each configuration of the sample holder, intersect each other, and are orthogonal to each other. Further, in the following, the viewing of a plane configured by the X direction and the Y direction from the Z direction may be described as a plan view.

Embodiment 1

<Regarding Sample Holder 100>

Hereinafter, an overview of a sample holder 100 according to the first embodiment will be described with reference to FIGS. 1 to 4. FIG. 1 is a schematic diagram illustrating the sample holder 100, a storage system 200 using the sample holder 100, and an analysis system 300 including the storage system 200.

The sample holder 100 is used in the charged particle beam device and includes a storage unit 1, a holder shaft 2, a placement unit 3, a moving mechanism 4, a rotating mechanism 5, a protrusion unit 6, and a guide unit 7. The storage unit 1 can store the placement unit 3 therein when the holder shaft 2 is moved. Further, the moving mechanism 4, the rotating mechanism 5, the protrusion unit 6, and the guide unit 7 are provided inside the storage unit 1.

The holder shaft 2 extends in the first direction (X direction) and is connected to the moving mechanism 4 and the rotating mechanism 5. The placement unit 3 on which a sample SAM can be placed is provided at a distal end of the holder shaft 2. The moving mechanism 4 is a mechanism for moving the holder shaft 2 in the X direction, and the rotating mechanism 5 is a mechanism for rotating the holder shaft 2 in a first rotation direction. Incidentally, the first rotation direction is the rotation direction with the center of the holder shaft 2 in a cross-sectional view perpendicular to an extending direction of the holder shaft 2 (X direction) as a rotation axis. The details of the protrusion unit 6 and the guide unit 7 will be described below with reference to FIGS. 5A to 5C.

A control unit C1 is electrically connected to the moving mechanism 4 and the rotating mechanism 5, and controls the operations of these. That is, the control unit C1 controls the movement of the holder shaft 2 in the X direction, and the rotation of the holder shaft 2 in the first rotation direction. Without using the control unit C1, an operator can directly operate the moving mechanism 4 or the rotating mechanism 5 to perform the movement and rotation of the holder shaft 2.

The storage system 200 includes the sample holder 100 and the control unit C1 and is applicable to a sample preparation device 400 and a sample observation device 500. For example, it is possible to configure the control unit C1 as a partial control unit of the sample preparation device 400, or a partial control unit of the sample observation device 500. The analysis system 300 includes the storage system 200 (sample holder 100), the sample preparation device 400, and the sample observation device 500 and can perform from the processing of the sample SAM to the observation of the sample SAM using a single sample holder 100.

FIGS. 2 to 4 illustrate an enlarged periphery of the placement unit 3 of the sample holder 100. FIGS. 2 and 3 illustrate an open state in which the holder shaft 2 is moved in the X direction and the placement unit 3 is positioned outside the storage unit 1. FIG. 4 illustrates a stored state in which the holder shaft 2 is moved in the X direction and the placement unit 3 is stored inside the storage unit 1. In the following description, expressions such as “open state” or “stored state” mean that the placement unit 3 is in the state described above.

The sample holder 100 further includes a support unit 8 extending in the first direction (X direction). The support unit 8 can move in the X direction in conjunction with the movement of the holder shaft 2 by the moving mechanism 4. The support unit 8 is adjacent to the holder shaft 2 and the placement unit 3 in a third direction (Z direction) intersecting the first direction (X direction). Further, the support unit 8 has a structure in which one side is opened in order not to inhibit the ion beam irradiation during processing in the sample preparation device 400. In the case of FIG. 2, the support unit 8 is present below the holder shaft 2 and the placement unit 3, but not present above the holder shaft 2 and the placement unit 3.

Further, the sample holder 100 further includes a rotary shaft member 9 extending in the third direction (Z direction) and fixed to the placement unit 3. The rotary shaft member 9 is fitted into a hole provided in the support unit 8 to the extent that the rotary shaft member 9 can be rotated in a second rotation direction. That is, the placement unit 3 is attached to the support unit 8 by the rotary shaft member 9. Incidentally, attachment of the rotary shaft member 9 to the support unit 8 is not particularly limited, for example, it may be a method of fixing by screwing the support unit 8 on the side opposite to the placement unit 3.

Incidentally, the second rotation direction is a rotation direction with the center of the rotary shaft member 9 in a cross-sectional view perpendicular to an extending direction of the rotary shaft member 9 (Z direction) as a rotation axis. The placement unit 3 fixed to the rotary shaft member 9 can be rotated in the second rotation direction according to the rotation of the rotary shaft member 9.

A hatch cover 10 is provided at a distal end of the support unit 8. The hatch cover 10 is formed in substantially the same size as an opening 14 of the storage unit 1. As illustrated in FIG. 4, in the stored state, the opening 14 is closed by the hatch cover 10. Further, the opening 14 of the storage unit 1 is provided with, for example, a sealing member 15 such as an O-ring. In the stored state, the hatch cover 10 is in close contact with the sealing member 15, thereby sealing the inside of the storage unit 1. Thus, the degree of vacuum inside the storage unit 1 is maintained.

As illustrated in FIGS. 2 and 3, the placement unit 3 is provided at the distal end of the holder shaft 2 through a transmission member (cam) 12. Further, at the distal end of the holder shaft 2, for example, an elastic member 13 such as a spring is provided so as to press the placement unit 3 against the transmission member 12. Further, the transmission member 12 includes a connection unit 12*a* and a transmission unit 12*b*. The connection unit 12*a* is fixed to the distal end of the holder shaft 2. The transmission unit 12*b* extends in the X direction from the connection unit 12*a* toward the placement unit 3 and contacts the placement unit 3.

The transmission member 12, the elastic member 13, and the rotary shaft member 9 can rotate the placement unit 3 in the second rotation direction, and the details will be described below with reference to FIGS. 13A to 13C.

<Regarding Protrusion Unit 6 and Guide Unit 7>

FIGS. 5A to 5C illustrate a side view of the protrusion unit 6 and the guide unit 7 and a cross-sectional view taken along the line A-A in the side view.

As illustrated in FIGS. 5A to 5C, the protrusion unit 6 is fixed to the holder shaft 2 so as to protrude in a second direction intersecting the first direction (X direction). The second direction may be a direction that intersects the extending direction of the holder shaft 2, may be the Y direction or the Z direction, or may be a different direction from these. The protrusion unit 6 is rotated when the holder shaft 2 is rotated by the rotating mechanism 5 and moves when the holder shaft 2 is moved by the moving mechanism 4. That is, the position of the protrusion unit 6 is changed according to the rotation and movement of the holder shaft 2.

The guide unit 7 surrounds an outer periphery of the holder shaft 2 in the first rotation direction and is separated from the holder shaft 2. Since the guide unit 7 is not affected by the operation of the holder shaft 2, the position of the guide unit 7 is not changed according to the rotation and movement of the holder shaft 2.

Further, the guide unit 7 is provided with a through hole 7*a*, and a through hole 7*b* communicating with the through hole 7*a*. The width of the through hole 7*a* in the first rotation direction is larger than the width of the through hole 7*b* in the first rotation direction. The protrusion unit 6 is capable of moving inside the through hole 7*a* and inside the through hole 7*b*.

FIG. 5A illustrates a state of the protrusion unit 6 in the open state. When the holder shaft 2 is rotated by the rotating mechanism 5, the protrusion unit 6 moves the inside of the through hole 7*a* along the first rotation direction. That is, in the open state, since the movement of the protrusion unit 6 in the first rotation direction is not limited, the holder shaft 2 can be rotated in the first rotation direction. On the other hand, since the movement of the protrusion unit 6 in the X direction is limited, the holder shaft 2 can not be moved in the X direction.

FIG. 5B illustrates a state of the protrusion unit 6 at the time of switching between the open state and the stored state. Inside the through hole 7*a*, when the protrusion unit 6 is positioned in the communicating location between the through hole 7*a* and the through hole 7*b*, the protrusion unit 6 becomes possible to move inside the through hole 7*b* along the X direction with the movement of the holder shaft 2 by the moving mechanism 4. That is, the open and stored states can be switched only when the rotational state of the protrusion unit 6 is such that the protrusion unit 6 can move inside the through hole 7*b*. In other words, the moving mechanism 4 can be driven only when the holder shaft 2 satisfies a specific rotational state due to the spatial interference of the protrusion unit 6 and the guide unit 7.

FIG. 5C illustrates a state of the protrusion unit 6 in the stored state. When the holder shaft 2 is moved by the moving mechanism 4, the protrusion unit 6 moves inside the through hole 7*b* along the X direction. That is, in the stored state, since the movement of the protrusion unit 6 in the X direction is not limited, the holder shaft 2 can be moved in the X direction. On the other hand, since the movement of the protrusion unit 6 in the first rotation direction is limited, the holder shaft 2 can not be rotated in the first rotation direction. Incidentally, after the placement unit 3 is completely stored inside the storage unit 1, since the protrusion unit 6 passes through the guide unit 7, it is also possible to rotate the holder shaft 2 in the first rotation direction.

Steps S1 to S3 illustrated in FIG. 6 are a flowchart in the case of switching from the stored state to the open state, and steps S4 to S6 illustrated in FIG. 6 are a flowchart in the case of switching from the open state to the storage state.

In step S1, it is checked whether the rotational state of the holder shaft 2 is a specific rotational state. In the case other than a specific rotational state, the rotating mechanism 5 in the stored state is driven and rotates the holder shaft 2 so that the rotational state of the holder shaft 2 is the specific rotational state.

In step S2, when the rotational state of the holder shaft 2 is confirmed to be a specific rotational state, the moving mechanism 4 is driven to move the holder shaft 2 in the X direction and the placement unit 3 from the inside of the storage unit 1 to the outside. This movement is performed until the protrusion unit 6 reaches the communicating location between the through hole 7*a* and the through hole 7*b*. That is, the transition is made from FIG. 5C to FIG. 5B.

In step S3, the sample holder 100 is in an open state. By driving the rotating mechanism 5 from the state of FIG. 5B, the holder shaft 2 can be rotated in the first rotation direction as illustrated in FIG. 5A.

In step S4, the rotating mechanism 5 in the open state is driven and rotates the holder shaft 2 so that the rotational state of the holder shaft 2 is a specific rotational state. Thus, the protrusion unit 6 is moved to the communicating location between the through hole 7*a* and the through hole 7*b*. That is, the transition is made from FIG. 5A to FIG. 5B.

In step S5, the moving mechanism 4 is driven to move the holder shaft 2 in the X direction and the placement unit 3 from the outside of the storage unit 1 to the inside. That is, the transition is made from FIG. 5B to FIG. 5C.

In step S6, the sample holder 100 is in a stored state. In steps S1 to S6, the driving of the moving mechanism 4 and the driving of the rotating mechanism 5 may be performed by the control unit C1 or may be performed by the operator.

In the related art, in order to know the rotational state of the holder shaft 2, a method of evaluating from the read value of the encoder and the like has been generally performed. Therefore, it was necessary to calibrate the evaluation value.

In these methods, it becomes difficult to grasp the rotational state of the holder shaft 2 when a trouble in the electric system or a calibration error occurs.

In the first embodiment, only when the rotational state of the holder shaft 2 is a specific rotational state, it is possible to move the holder shaft 2 in the X direction by using the protrusion unit 6 and the guide unit 7. Therefore, it is possible to easily perform switching between the open state and the stored state.

<Regarding Placement Unit 3 and Placement of Sample SAM>

Figure 8:
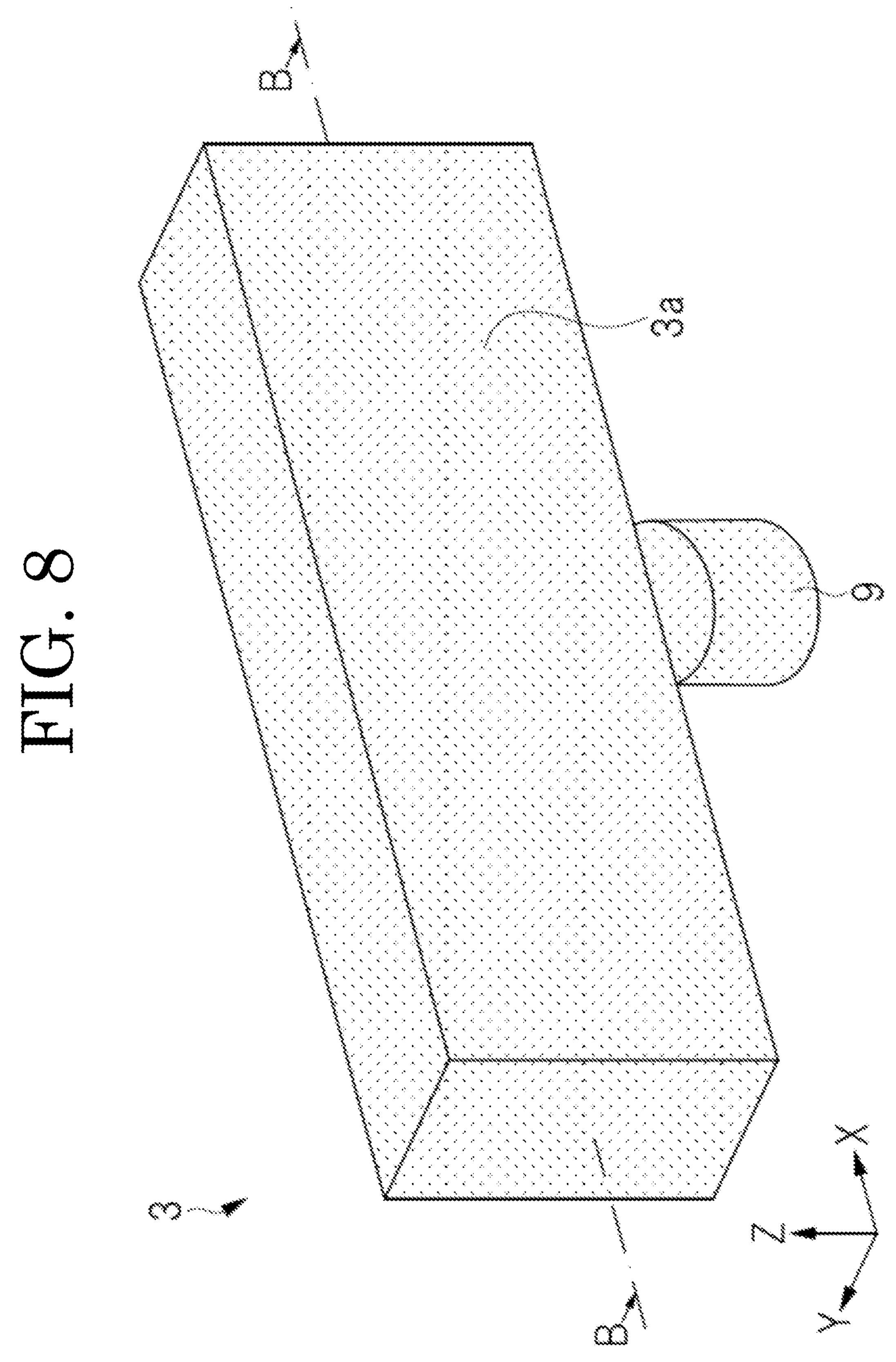
FIG. 8 is a perspective view illustrating the placement unit according to the first embodiment.
Figure 9:
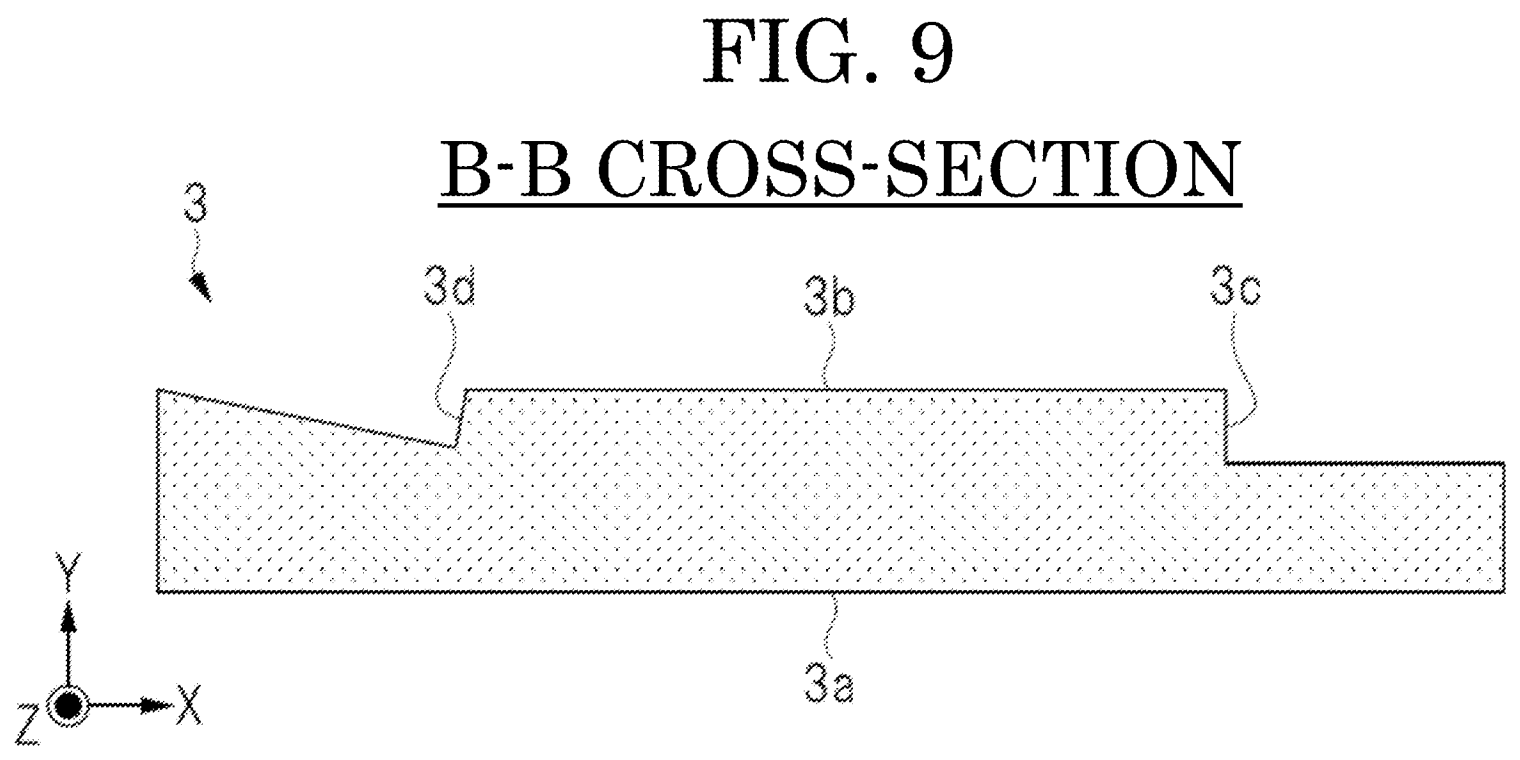

FIGS. 7 to 9 illustrate the detailed structure of the placement unit 3. FIG. 9 is a cross-sectional view taken along the line B-B of FIGS. 7 and 8.

The placement unit 3 forms a flat plate shape in which the width in the Y direction is smaller than the width in the X direction and the width in the Z direction. Further, the placement unit 3 can be rotated in the second rotation direction according to the rotation of the rotary shaft member 9.

The placement unit 3 includes a first plane (placing surface) 3*a* in which the sample SAM is placed, and a second plane 3*b* on the side opposite to the first plane 3*a*. On the second plane 3*b*, a groove 3*c* forming a concave shape from the second plane 3*b* side toward the first plane 3*a* side is provided, and a groove 3*d* is provided at a position away from the groove 3*c* in the X direction. The groove 3*d* is tilted at a constant angle with respect to the second plane 3*b* and forms a shape such that the depth is intermittently deeper as it approaches the groove 3*c*. In other words, the groove 3*d* forms a shape such that the thickness between the first plane 3*a* and the second plane 3*b* is intermittently thinner as approaching the groove 3*c*. The groove 3*c* can be mainly used as a guide for the elastic member 13 and the groove 3*d* can be mainly used for mounting a mounting unit 22 of a mesh holder 20.

Figure 10:
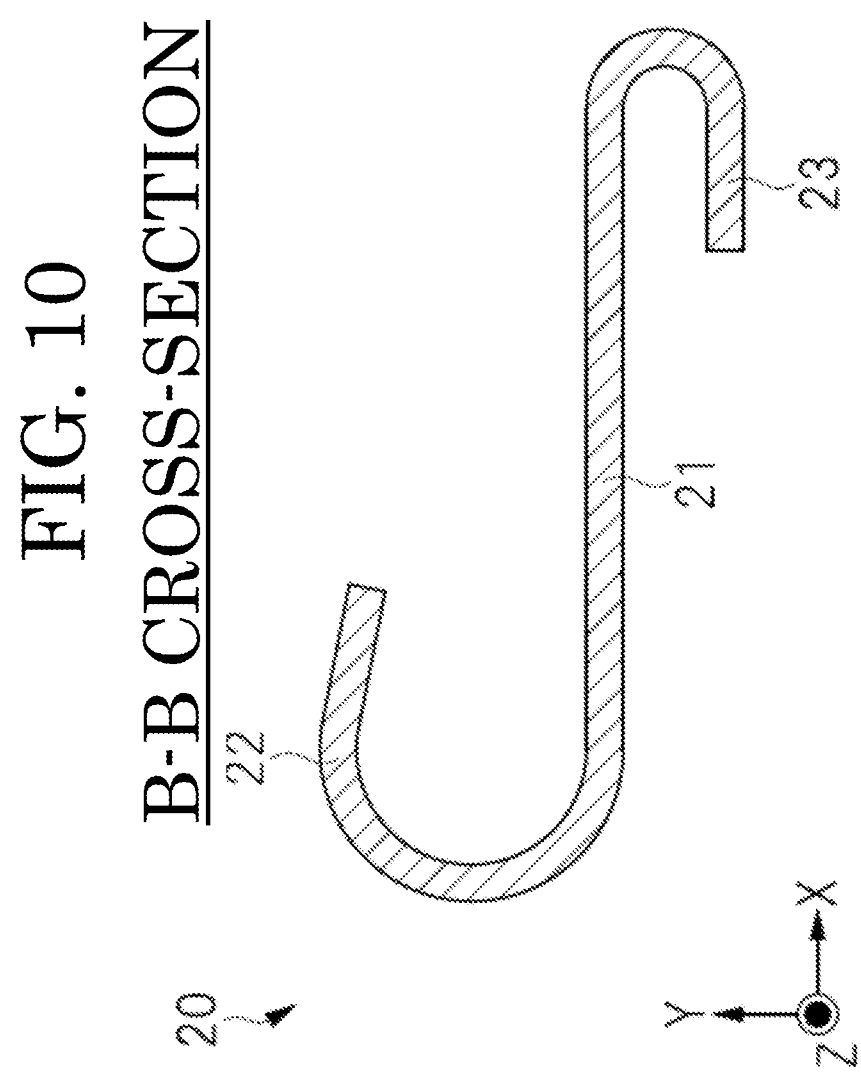
FIG. 10 is a cross-sectional view illustrating a mesh holder according to the first embodiment.
Figure 11:
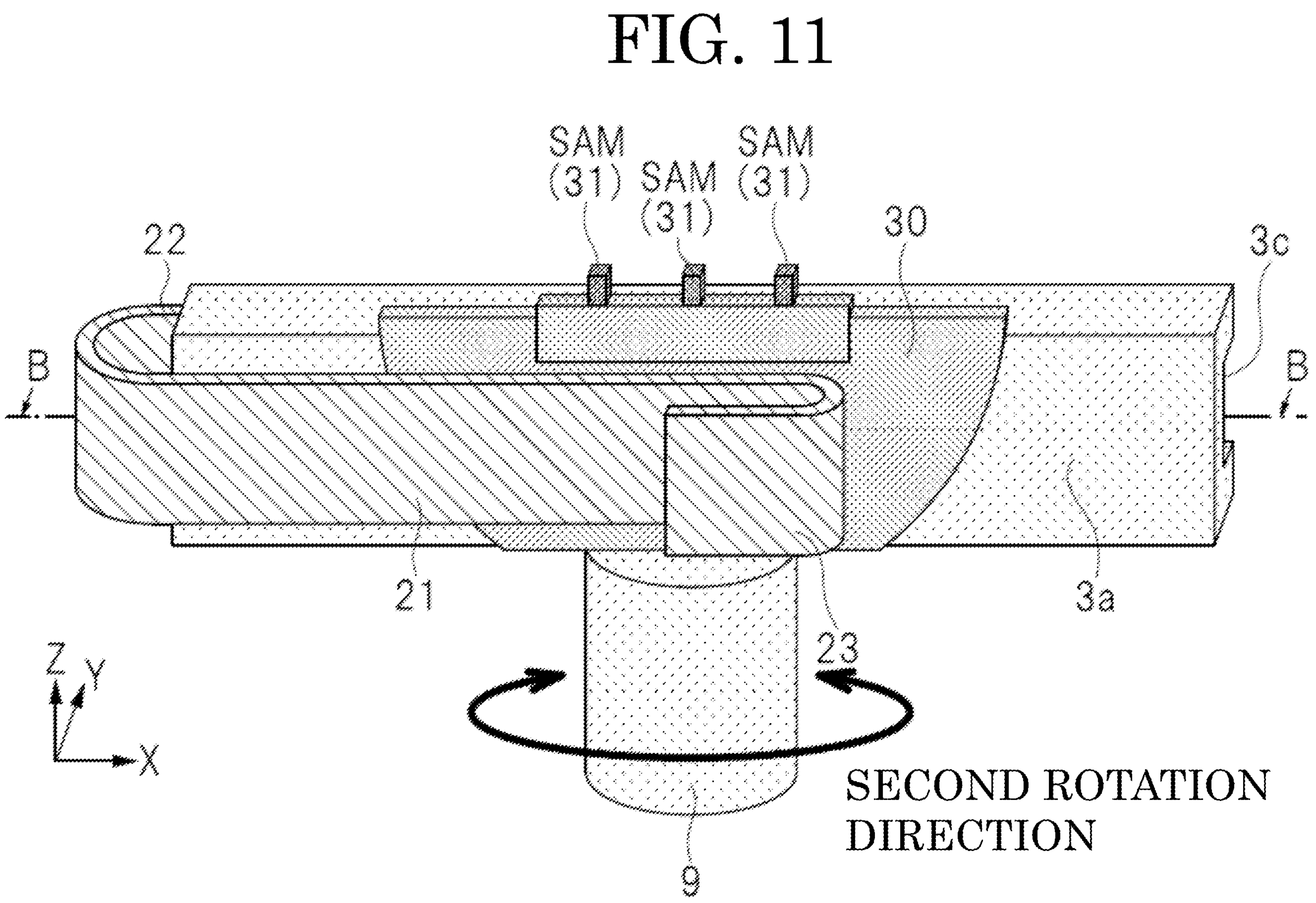
FIG. 11 is a perspective view illustrating the placement unit, a mesh, and the mesh holder according to the first embodiment.
Figure 12:
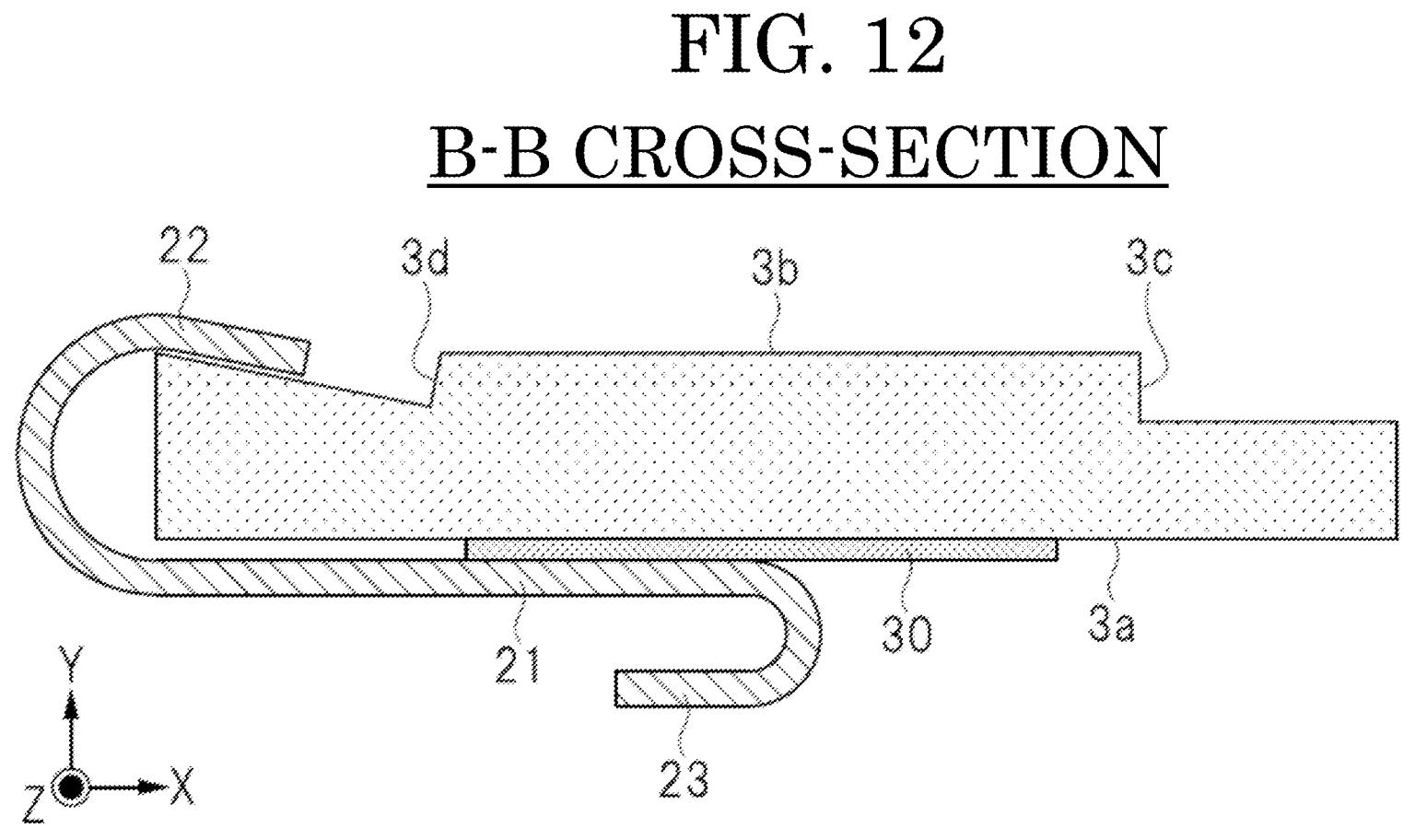

FIG. 10 illustrates the mesh holder 20 for placing a mesh 30 on the placement unit 3. FIGS. 11 and 12 illustrate a state in which the mesh 30 on which the sample SAM is mounted is placed on the placement unit 3 using the mesh holder 20. Incidentally, FIG. 12 is a cross-sectional view taken along the line B-B of FIG. 11.

As illustrated in FIGS. 10 to 12, the mesh holder 20 includes a sandwiching unit 21 of a flat plate shape, the mounting unit 22 for forming a hook shape, and a detachable unit 23 bent from the sandwiching unit 21. Incidentally, the sandwiching unit 21, the mounting unit 22, and the detachable unit 23 are integral members and made of elastic members. A distal end of the hook of the mounting unit 22 has a structure so as to be tilted at a constant angle with respect to the second plane 3*b* and forms a tilt angle of the same degree as the groove 3*d*.

As illustrated in FIG. 11, the sample SAM can be mounted on the mesh 30, and the mesh 30 is, for example, a half mesh of about 3 mm diameter, and includes one or more micro-pillars 31. The sample SAM is prepared by the sample preparation device 400 or the like and is attached to the micro-pillar 31 by deposition.

When placing the mesh 30 on the placement unit 3, the mesh 30 can be inserted between the first plane 3*a* and the sandwiching unit 21 while fitting the mounting unit 22 in a hook shape into the groove 3*d*. First, the mesh holder 20 is fixed to the placement unit 3 by fitting the distal end of the mounting unit 22 to the groove 3*d*. Next, the operator grabs the detachable unit 23 using a jig or tool, when moving the detachable unit 23 so as to be away from the first plane 3*a*, a gap between the first plane 3*a* and the sandwiching unit 21 is generated. Next, the mesh 30 is inserted into the gap. Thereafter, the operator moves the detachable unit 23 so as to approach the first plane 3*a*, or when the operator releases the detachable unit 23, the mesh 30 is pressed against the sandwiching unit 21. Incidentally, even when taking out the mesh 30, the operator grabs the detachable unit 23 to take out the mesh 30 from between the first plane 3*a* and the sandwiching unit 21.

According to the mesh holder 20, since the structure of holding the mesh 30 can be achieved without using a screw, the structure of each of the mesh holder 20 and the placement unit 3 can be made smaller. Further, the operator simply performs the operation of grasping the detachable unit 23 to quickly replace the mesh 30 in a short time.

<Regarding Transmission Member 12 and Elastic Member 13>

With reference to FIGS. 13A to 13C, the roles of each of the transmission member 12 and the elastic member 13, and the rotation operation of the placement unit 3 in the second rotation direction will be described. The state of FIG. 13A corresponds to the state of FIG. 5B and the state of FIG. 13B or 13C corresponds to the state of FIG. 5A.

As described in FIGS. 2 and 3, the distal end of the holder shaft 2 is provided with the elastic member 13 so as to press the placement unit 3 against the transmission member 12. The transmission member 12 includes the connection unit 12*a* fixed to the distal end of the holder shaft 2, and the transmission unit 12*b* extending in the X direction from the connection unit 12*a* toward the placement unit 3. In the cross-sectional view perpendicular to the X direction, the transmission unit 12*b* forms a circular shape.

As illustrated in FIG. 13A, the transmission unit 12*b* contacts the first plane 3*a* of the placement unit 3, and the elastic member 13 presses the placement unit 3 against the transmission member 12 (transmission unit 12*b*) in the interior of the groove 3*c*. Since the groove 3*c* is responsible for the role of the guide of the elastic member 13, the elastic member 13 can be prevented from being removed from the placement unit 3.

Further, as illustrated in the "C-C cross section", in the cross-sectional view perpendicular to the first direction (X direction), the center of the transmission unit 12*b* is deviated from the center of the holder shaft 2. Therefore, when the holder shaft 2 is rotated in the first rotation direction, the transmission unit 12*b* moves in the first rotation direction while drawing a large trajectory around the holder shaft 2 with the center of the holder shaft 2 as a rotation axis.

That is, as illustrated in FIGS. 13B and 13C, when the holder shaft 2 is rotated by the rotating mechanism 5, the contact position between the first plane 3*a* and the transmission unit 12*b* is changed along the first rotation direction. By such a movement of the transmission unit 12*b*, the placement unit 3 is pressed against the transmission unit 12*b* and rotated in the second rotation direction together with the rotary shaft member 9. Further, the placement unit 3 is always given a reaction force by the elastic member 13 to be always pressed against the transmission member 12. In other words, the placement unit 3 follows the movement of the transmission unit 12*b* by the reaction force.

Thus, the transmission member 12 and the elastic member 13 can synchronize the rotation of the holder shaft 2 in the first rotation direction with the rotation of the placement unit 3 in the second rotation direction. And, the structure using these is, in principle, a rotation operation without backlash and is superior to the rotating mechanism using a gear structure in terms of positional accuracy, and the like.

Further, since only the second plane 3*b* side of the placement unit is used for mounting the elastic member 13, the space-saving rotating mechanism can be achieved. It is also conceivable to attach the elastic member 13 to the member other than the holder shaft 2. For example, when attaching the elastic member 13 to the support unit 8, the thickness of the member for attaching the screw or the like is affected. Therefore, in order to make the placement unit 3 and each of the surrounding members thinner, it is desirable to attach the elastic member 13 to the holder shaft 2.

Incidentally, since the reaction force is changed due to the positional relationship between the elastic member 13 and the transmission unit 12*b*, a slope such as the groove 3*d* may be provided in the groove 3*c* to alleviate the change in the reaction force. The cross section of the transmission unit 12*b* may be changed from a circular shape to an elliptical shape. It is also possible to change the shape of the elastic member 13.

Incidentally, in the cross-sectional view perpendicular to the first direction (X direction), the opening 14 of the storage unit 1 and the hatch cover 10 form an oval shape or an elliptical shape having the third direction (Z direction) as a long axis, respectively. In the sample holder 100, the placement unit 3 is adopted in which the width in the Y direction has a relatively thin flat plate shape, and the mesh holder 20 and the mesh 30 and the like are used to place the sample SAM on the first plane 3*a*. Since the opening 14 has an oval shape having the Z direction as a long axis, it is possible to correspond to such a flat plate shape.

Then, in the stored state, the sealing member 15 provided in the opening 14, and the hatch cover 10 are in close contact with each other. Thus, it is possible to maintain the internal airtightness of the storage unit 1. Incidentally, the sealing member 15 is constituted by an oval or elliptical-shaped O-ring according to the shape of the opening 14.

Here, as illustrated in FIGS. 13B and 13C, when the placement unit 3 is rotated, in the Y direction, the placement unit 3 may protrude from the support unit 8 and not fit within the opening 14 of the storage unit 1. In a state in which the placement unit 3 remains rotated, when the transition is made to the stored state as illustrated in FIG. 4, the placement unit 3 interferes with the storage unit 1. That is, as illustrated in FIG. 11, when the sample SAM is placed on the placement unit 3, there is a risk that the sample SAM is damaged.

Therefore, when transitioning to the stored state, the holder shaft 2 is in a specific rotational state as illustrated in FIG. 5B. When the protrusion unit 6 moves inside of the through hole 7*b* along the X direction, the first plane 3*a* is parallel to a plane configured by the X direction and the Y direction as illustrated in FIG. 13A. Therefore, it is possible to eliminate the problem that the placement unit 3 interferes with the storage unit 1.

On the other hand, in the open state, the holder shaft 2 can be rotated in the first rotation direction as illustrated in FIG. 5A, and the placement unit 3 can be rotated in the second rotation direction as illustrated in FIGS. 13B and 13C. Therefore, for example, when irradiating the sample SAM with an ion beam in the sample preparation device 400, or when irradiating the sample SAM with an electron beam in the sample observation device 500, it is possible to tilt the sample SAM.

<Sample Preparation Device 400>

FIG. 14 is a schematic diagram illustrating the sample preparation device 400 according to the first embodiment. The sample preparation device 400 is comprised of a charged particle beam device, such as an FIB device.

The sample preparation device 400 includes a sample chamber 40, an ion source 41, an irradiation lens 42, an aperture 43, a scanning electrode 44, an objective lens 45, a secondary electron detector 46, a deposition gun 47, a microprobe 48, and a controller C2. The sample holder 100 can be inserted into the sample chamber 40. On the placement unit 3, the processed sample SAM can be placed by using the mesh 30 and the like.

The controller C2 is electrically connected to the ion source 41, the irradiation lens 42, the aperture 43, the scanning electrode 44, the objective lens 45, the secondary electron detector 46, the deposition gun 47, and the microprobe 48, and controls the operations of these. The controller C2 is also electrically connected to a controller C3 of the sample observation device 500 and can communicate the information with the controller C3.

The control unit C1 for controlling each operation of the sample holder 100 as part of the sample preparation device 400 is electrically connected to the controller C2. That is, the storage system 200 is included in the sample preparation device 400. The sample holder 100 is instructed from the controller C2 via the control unit C1 and each operation of the sample holder 100 is controlled by the controller C2.

Since the placement unit 3 can be rotated in the second rotation direction by the instruction from the controller C2, the sample SAM placed on the placement unit 3 can change the tilt angle on the optical axis of an ion beam IB. Therefore, it is possible to process the sample SAM from various angles.

An input device 70 and a display 71 are provided inside or outside each of the sample preparation device 400 or the sample observation device 500. The input device 70 is a device for the operator to enter instructions such as input of information to be analyzed, and modification of the irradiation conditions of the ion beam IB and an electron beam EB1. The input device 70 may be, for example, a keyboard or a mouse. The display 71 is a screen for controlling each configuration of the sample preparation device 400 and the sample observation device 500. When various instructions are input by the input device 70, the above instructions are transmitted to the controller C2 or the controller C3.

The ion source 41 is capable of emitting the ion beam IB. The ion beam IB emitted from the ion source 41 is focused by the irradiation lens 42 and the aperture 43, passed through the objective lens 45, and converged on the sample SAM. The scanning electrode 44 located above the objective lens 45 deflects and scans the ion beam IB incident on the sample SAM by the instruction of the controller C2.

Above the sample holder 100, the secondary electron detector 46, the deposition gun 47, and the microprobe 48 are attached to the sample chamber 40.

When the sample SAM is irradiated with the ion beam IB, the sample SAM is sputtered and secondary electrons are generated from the sample SAM. The secondary electrons generated are detected by the secondary electron detector 46. The secondary electron detector 46 includes a circuit or arithmetic processing unit for computing the secondary electrons as a detection signal and converting them into an image.

The gas emitted from the deposition gun 47 toward the sample SAM reacts with the ion beam IB and is decomposed. Then, metal is deposited as a film on the sample SAM in an ion beam IB irradiation region. This deposited film is used as a protective film on the surface of the sample SAM before processing, and is used to fix minute sample pieces to the sample stage. Further, by using the microprobe 48, it is possible to convey the processed sample SAM to the placement unit 3 of the sample holder 100.

<Sample Observation Device 500>

FIG. 15 is a schematic diagram illustrating the sample observation device 500 according to the first embodiment. The sample observation device 500 is comprised of a charged particle beam device, such as a TEM.

The sample observation device 500 includes a sample chamber 50, an electron source 51, an irradiation lens 52, a scanning coil 53, a holder adapter 54, a secondary electron detector 55, an objective lens 56, a projection lens 57, an annular detector 58, a detector 59, a camera 60, and the controller C3. The sample holder 100 can be inserted into the sample chamber 50 by using the holder adapter 54.

The controller C3 is electrically connected to the electron source 51, the irradiation lens 52, the scanning coil 53, the holder adapter 54, the secondary electron detector 55, the objective lens 56, the projection lens 57, the annular detector 58, the detector 59, and the camera 60, and controls the operations of these.

The control unit C1 for controlling each operation of the sample holder 100 as part of the sample observation device 500 is electrically connected to the controller C3. That is, the storage system 200 is included in the sample observation device 500. The sample holder 100 is instructed from the controller C3 via the control unit C1 and each operation of the sample holder 100 is controlled by the controller C3.

Since the placement unit 3 can be rotated in the second rotation direction by the instruction from the controller C3, the sample SAM placed on the placement unit 3 can change the tilt angle on the optical axis of the electron beam EB1. Therefore, it is possible to observe the sample SAM from various angles.

The electron source 51 is capable of emitting the electron beam EB1. The scanning coil 53 is provided between the irradiation lens 52 and the objective lens 56, and the sample SAM is inserted below the scanning coil 53. The secondary electron detector 55 is provided above the sample SAM and below the scanning coil 53. The secondary electron detector 55 includes a circuit or arithmetic processing unit for computing the secondary electrons as a detection signal and converting them into an image.

The electron beam EB1 emitted from the electron source 51 is spot focused on the sample SAM by the irradiation lens 52, and the sample SAM is scanned with the electron beam EB1 by the scanning coil 53. The secondary electron detector 55 can detect secondary electrons generated from the sample SAM by the irradiation with an electron beam EB1 and generate a secondary electron image. Such a secondary electron image can be viewed on the display 71.

The annular detector 58 for STEM dark field image observation is disposed below the projection lens 57. Below the annular detector 58, the detector 59 (a detector for STEM bright field image observation) capable of entering and removing from the electron beam axis is provided. The camera 60 for transmission image observation is disposed below the detector 59.

By changing the conditions of the irradiation lens 52, the sample SAM is irradiated with the electron beam EB1 having a certain spread, transmission electrons EB2 transmitted through the sample SAM is imaged by the objective lens 56, and the image is magnified by the projection lens 57 and displayed on the camera 60. The detector 59 can detect the transmission electrons EB2 to generate a bright-field transmission electron image. The annular detector 58 can detect electrons scattered from the sample SAM (elastically scattered electrons) by the irradiation with the electron beam EB1 to generate a dark-field transmission electron image.

By changing the tilt angle of the sample SAM on the optical axis of the electron beam EB1, it is possible to observe the sample SAM from various angles and observe the secondary electron image, a scanning transmission image, and the transmission electron image. They are also stored as image data in the controller C3.

FIG. 16 illustrates a state in which the sample SAM is irradiated with the ion beam IB in the sample preparation device 400, and FIG. 17 illustrates a state in which the sample SAM is irradiated with the electron beam EB1 in the sample observation device 500. In FIG. 17, observation is performed with the direction of the sample holder 100 perpendicular to that in FIG. 16 in order to use the transmitted electrons EB2 passing through the sample SAM.

<Sample Preparation Means and Sample Observation Means>

With reference to FIG. 18 below, a sample preparation means provided with the sample preparation device 400, and a sample observation means provided with the sample observation device 500 will be described. Steps S11 to S16 illustrated in FIG. 18 correspond to the sample preparation means, and steps S17 to S19 illustrated in FIG. 18 correspond to the sample observation means.

In step S11, the sample SAM is prepared inside the sample chamber 40 of the sample preparation device 400. The sample SAM may be a substance that reacts with the atmospheric constituents or deteriorates under the atmosphere. The sample SAM may be prepared in a pre-vacuumed space to prevent structural deterioration.

In step S12, in the open state, the sample holder 100 is inserted into the sample chamber 40. The method of placing the sample holder 100 in the open state is the same as in steps S1 to S3 of FIG. 6. Incidentally, when the sample holder 100 is in an open state before inserting the sample holder 100 into the sample preparation device 400, the airtight state inside the storage unit 1 is opened, but the air inside the storage unit 1 can be exhausted by an exhaust system of the sample preparation device 400.

In step S13, first, the inside of the sample chamber 40 is placed in a high vacuum state. The sample SAM is irradiated with the ion beam IB, and a part of the sample SAM is processed. Next, the sample SAM is placed on unit 3 by using the deposition gun 47 and the microprobe 48. Here, the sample SAM is attached to the micro-pillar 31 on the mesh 30 placed on the placement unit 3 using the mesh 30. Here, instead of attaching the sample SAM to the micro-pillar 31, the sample SAM may be placed directly on the mesh 30 or the placement unit 3.

In step S14, the sample SAM is irradiated with the ion beam IB and a part of the sample SAM is further processed. At this time, by rotating at least one of the placement unit 3 or the sample holder 100, the angle between the placement unit 3 and the ion beam IB can be adjusted, and the sample SAM can be processed from various directions.

In step S15, the placement unit 3 is stored inside the storage unit 1. The method of placing the sample holder 100 in the stored state is the same as in steps S4 to S6 of FIG. 6. In the stored state, since the hatch cover 10 and the sealing member 15 are in contact with each other and the storage unit 1 is sealed, the inside of the storage unit 1 is kept in the same high vacuum state as the inside of the sample chamber 40.

In step S16, the sample holder 100 is taken from the sample chamber 40, and conveyed to the sample observation device 500. At this time, since the sample holder 100 is in a stored state, even if the sample holder 100 is taken out into the atmosphere, the inside of the storage unit 1 is maintained in a high vacuum state.

In step S17, the sample holder 100 is inserted into the sample chamber 50. At this time, the sample holder 100 is in a stored state with the sample SAM processed in the sample preparation device 400 placed on the placement unit 3 and the placement unit 3 stored inside the storage unit 1. The inside of the sample chamber 50 is in a high vacuum state beforehand.

In step S18, the holder shaft 2 is moved in the X direction to move the placement unit 3 to the outside of the storage unit 1. That is, the sample holder 100 is in an open state. The method of placing the sample holder 100 in the open state is the same as in steps S1 to S3 of FIG. 6.

In step S19, the sample SAM is irradiated with the electron beam EB1 to observe the sample SAM. Thus, it is possible to observe the secondary electron image, the scanned transmission image, and the transmission electron image and acquire image data thereof.

In the related art, for the sample deteriorated under the atmosphere, it was necessary to convey the sample to the sample holder in a glove box according to the purpose. Therefore, the complexity and low efficiency of the work were problems. Further, when attempting to implement the sample preparation means and the sample observation means described above by a single sample holder, the portion where the sample SAM is placed needs to be a thin flat plate shape in a pole piece gap direction. Further, in the switching between the open state and the stored state of the sample holder 100, it is necessary to reduce the possibility that the placement unit 3 interferes with the storage unit 1.

The sample holder 100 of the first embodiment can correspond to a flat plate shape and can switch between the open state and the stored state only when the holder shaft 2 is in a specific rotational state. Therefore, the sample preparation means and the sample observation means can be efficiently and reliably performed. Thus, according to the first embodiment, the sample preparation device 400 can provide a highly versatile sample holder 100 so as to be shared with the sample observation device 500.

Modification

A modification of the first embodiment will be described below with reference to FIGS. 19 to 21. In the following, the differences from the first embodiment will be mainly described, and the description for the points duplicated in the first embodiment will be omitted.

As illustrated in FIG. 19, the sample holder 100 and the storage system 200 of the modification further include a sensor 11*a* and a read operation mechanism 11*b* as compared to FIG. 1. The sensor 11*a* is attached to the holder shaft 2, located in the vicinity of the guide unit 7 and the protrusion unit 6, and provided for detecting the position of the protrusion unit 6. That is, the sensor 11*a* can detect a change in the position of the protrusion unit 6 in the first rotation direction.

The read operation mechanism 11*b* is a mechanism for automatically performing switching between the open state and the stored state, for example, a button. The control unit C1 is electrically connected to the sensor 11*a* and the read operation mechanism 11*b* and can calculate the rotational state of the holder shaft 2 from the position of the protrusion unit 6 detected by the sensor 11*a*.

The operator drives the read operation mechanism 11*b* (pushes the button) to cause the control unit C1 instructs the sensor 11*a* to detect the position of the protrusion unit 6 by the sensor 11*a*. Next, the control unit C1 calculates the rotational state of the holder shaft 2 from the position of the protrusion unit 6. Next, the control unit C1 instructs the rotating mechanism 5 to rotate the holder shaft 2 by the rotating mechanism 5 so that the protrusion unit 6 can move inside the through hole 7*b* (so that the rotational state of the holder shaft 2 is in a specific rotational state). Thereafter, the control unit C1 instructs the moving mechanism 4 to move the holder shaft 2 in the X direction by the moving mechanism 4. Thus, it is possible to automatically switch between the open state and the stored state.

Since the guide unit 7 is not affected by the rotation of the holder shaft 2, the position where the protrusion unit 6 can move inside the through hole 7*b* is known in advance. That is, the information on which position of the protrusion unit 6 will bring the holder shaft 2 to a specific rotational state is stored in the control unit C1 in advance.

Further, instead of driving the read operation mechanism 11*b* by the operator, the control unit C1 may be responsible for driving the read operation mechanism 11*b*. For example, when the storage system 200 is included in the sample preparation device 400 or the sample observation device 500, a GUI or the like corresponding to the read operation mechanism 11*b* may be displayed on the display 71, which may then be operated by the operator. In that case, the controller C2 or the controller C3 instructs the sensor 11*a* via the control unit C1 to detect the position of the protrusion unit 6 by the sensor 11*a*.

Figure 21:
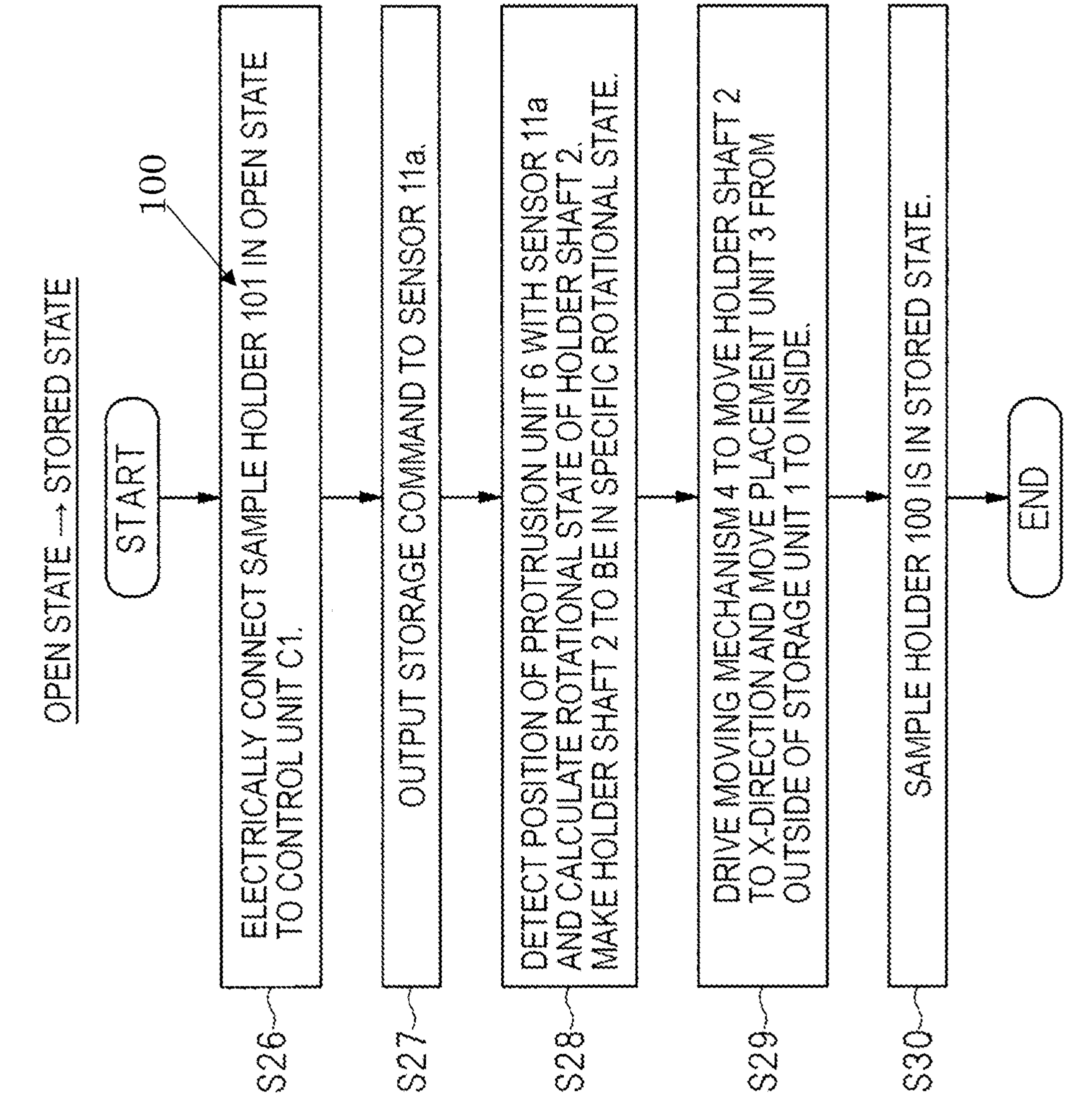
FIG. 21 is a flowchart illustrating a switch from the open state to the stored state according to the modification.

FIGS. 20 and 21 are flowcharts performed using the sensor 11*a* and the read operation mechanism 11*b*, and is a flowchart showing a switch between the open state and the stored state. Steps S21 to S25 illustrated in FIG. 20 is a flowchart in the case of switching from the stored state to the open state. Steps S26 to S30 illustrated in FIG. 21 is a flowchart in the case of switching from the open state to the stored state.

In step S21, the sample holder 100 in the stored state is electrically connected to the control unit C1. Thus, the moving mechanism 4, the rotating mechanism 5, the sensor 11*a*, and the read operation mechanism 11*b* can be controlled by the control unit C1.

In step S22, an open command is output to the sensor 11*a* by the operation of the read operation mechanism 11*b* or the control unit C1.

In step S23, the sensor 11*a* detects the position of the protrusion unit 6. Next, the control unit C1 calculates the rotational state of the holder shaft 2 from the position of the protrusion unit 6. When the rotational state of the holder shaft 2 is not a specific rotational state, the rotating mechanism 5 is driven to rotate the holder shaft 2 so that the rotational state of the holder shaft 2 is a specific rotational state. Here, after the rotational state of the holder shaft 2 is controlled, the signal from the sensor 11*a* may be read again by the control unit C1 to check the position of the protrusion unit 6.

In step S24, when the rotational state of the holder shaft 2 is confirmed to be a specific rotational state, the moving mechanism 4 is driven to move the holder shaft 2 in the X direction and the placement unit 3 from the inside of the storage unit 1 to the outside. This movement is performed until the protrusion unit 6 reaches the communicating location between the through hole 7*a* and the through hole 7*b*. That is, the transition is made from FIG. 5C to FIG. 5B.

In step S25, the sample holder 100 is in an open state. By driving the rotating mechanism 5 from the state of FIG. 5B, the holder shaft 2 can be rotated in the first rotation direction as illustrated in FIG. 5A.

In step S26, the sample holder 100 in the open state is electrically connected to the control unit C1. Thus, the moving mechanism 4, the rotating mechanism 5, the sensor 11*a*, and the read operation mechanism 11*b* can be controlled by the control unit C1.

In step S27, a storage command is output to the sensor 11*a* by the operation of the read operation mechanism 11*b* or the control unit C1.

In step S28, the sensor 11*a* detects the position of the protrusion unit 6. Next, the control unit C1 calculates the rotational state of the holder shaft 2 from the position of the protrusion unit 6. When the rotational state of the holder shaft 2 is not a specific rotational state, the rotating mechanism 5 is driven to rotate the holder shaft 2 so that the rotational state of the holder shaft 2 is a specific rotational state. Here, after the rotational state of the holder shaft 2 is controlled, the signal from the sensor 11*a* may be read again by the control unit C1 to check the position of the protrusion unit 6.

In step S29, when the rotational state of the holder shaft 2 is confirmed to be a specific rotational state, the moving mechanism 4 is driven to move the holder shaft 2 in the X direction and the placement unit 3 from the outside of the storage unit 1 to the inside. That is, the transition is made from FIG. 5B to FIG. 5C.

In step S30, the sample holder 100 is in a stored state.

As described above, by using the sensor 11*a* and the read operation mechanism 11*b*, it is possible to automatically switch between the open state and the stored state.

Second Embodiment

The second embodiment will be described below with reference to FIGS. 22A to 22C. In the following, the differences from the first embodiment will be mainly described, and the description for the points duplicated in the first embodiment will be omitted.

In the first embodiment, the protrusion unit 6 is fixed to the holder shaft 2, and the through hole 7*a* and the through hole 7*b* are provided in the guide unit 7. In the second embodiment, as illustrated in FIGS. 22A to 22C, a recess 2*a* and a recess 2*b* are provided on the holder shaft 2, and the protrusion unit 6 is provided at a position spaced from the holder shaft 2 and is fixed to the guide unit 7. Further, the protrusion unit 6 extends in a direction (second direction) intersecting the extending direction (first direction) of the holder shaft 2. The recess 2*a* communicates with the recess 2*b* and the width of the recess 2*a* in the first rotation direction is larger than the width of the recess 2*b* in the first rotation direction.

In the second embodiment, the position of the protrusion unit 6 as well as the position of the guide unit 7 is not changed according to the rotation and movement of the holder shaft 2. On the other hand, the position of the recess 2*a* and the position of the recess 2*b* is changed according to the rotation and movement of the holder shaft 2.

FIG. 22A illustrates a state of the holder shaft 2 and the protrusion unit 6 in the open state. When the holder shaft 2 is rotated by the rotating mechanism 5, the holder shaft 2 can be rotated along the first rotation direction in a state in which the protrusion unit 6 is fitted into the recess 2*a*. On the other hand, the holder shaft 2 can not be moved in the X direction.

FIG. 22B illustrates a state of the holder shaft 2 and the protrusion unit 6 at the time of switching between the open state and the stored state. Inside the recess 2*a*, when the protrusion unit 6 is located in the communicating location between the recess 2*a* and the recess 2*b*, the holder shaft 2 can move along the X direction. Further, after moving the holder shaft 2 from the storage state of FIG. 22C to the communicating location along the X direction, the holder shaft 2 is rotatable along the first rotation direction.

FIG. 22C illustrates a state of the holder shaft 2 and the protrusion unit 6 in the stored state. When the holder shaft 2 is moved by the moving mechanism 4, the holder shaft 2 can be moved along the X direction in a state in which the protrusion unit 6 is fitted into the recess 2*b*. On the other hand, the holder shaft 2 can not rotate in the first rotation direction.

Even with such the sample holder 100, it is possible to obtain the same effect as in the first embodiment.

Incidentally, although a case where the protrusion unit 6 is fixed to the guide unit 7 is illustrated here, the protrusion unit 6 need only be fixed so that the position of the protrusion unit 6 does not change as the holder shaft 2 is rotated and moved, and the protrusion unit 6 can be attached to other members.

Further, when applying the sensor 11*a* such as the above-described modification to the second embodiment, the sensor 11*a* is positioned in the vicinity of the protrusion unit 6 and is provided for detecting the communicating location between a first recess and a second recess. That is, the sensor 11*a* can detect a change in the position of the communicating location in the first rotation direction. Then, it is possible to calculate the rotational state of the holder shaft 2 from the position of the communicating location detected by the sensor 11*a*.

Although the present invention has been specifically described above based on the above embodiments, the present invention is not limited to the above embodiments, and various modifications can be made without departing from the scope of the invention.

REFERENCE SIGNS LIST

1: storage unit
2: holder shaft
2*a*, 2*b*: recess
3: placement unit
3*a*: first plane (placing plane)
3*b*: second plane
3*c*: groove
3*d*: groove
4: moving mechanism
5: rotating mechanism
6: protrusion unit
7: guide unit
7*a*, 7*b*: through hole
8: support unit
9: rotary shaft member
10: hatch cover
11*a*: sensor
11*b*: read operation mechanism
12: transmission member (cam)
12*a*: connection unit
12*b*: transmission unit
13: elastic member
14: opening
15: sealing member
20: mesh holder

21: sandwiching unit
22: mounting unit
23: detachable unit
30: mesh
31: micro-pillar
40: sample chamber
41: ion source
42: irradiation lens
43: aperture
44: scanning electrode
45: objective lens
46: secondary electron detector
47: deposition gun
48: microprobe
50: sample chamber
51: electron source
52: irradiation lens
53: scanning coil
54: holder adapter
55: secondary electron detector
56: objective lens
57: projection lens
58: annular detector
59: detector
60: camera
70: input device
71: display
100: sample holder
200: storage system
300: analysis system
400: sample preparation device
500: sample observation device
C1: control unit
C2: controller
C3: controller
EB1: electron beam
EB2: transmission electron
IB: ion beam
SAM: sample

The invention claimed is:

1. A sample holder used in a charged particle beam device, comprising:

a holder shaft that extends in a first direction;

a placement unit that is provided at a distal end of the holder shaft and on which a sample is placeable;

a moving mechanism that moves the holder shaft in the first direction;

a rotating mechanism that rotates the holder shaft in a first rotation direction with a center of the holder shaft in a cross-sectional view perpendicular to the first direction as a rotation axis;

a protrusion unit that is fixed to the holder shaft so as to protrude in a second direction intersecting the first direction and whose position is changed according to the rotation and movement of the holder shaft; and a guide unit that surrounds an outer periphery of the holder shaft in the first rotation direction and whose position is not changed according to the rotation and movement of the holder shaft, wherein the guide unit is provided with a first through hole and a second through hole communicating with the first through hole, a width of the first through hole in the first rotation direction is larger than a width of the second through hole in the first rotation direction, the protrusion unit is movable inside the first through hole and inside the second through hole, the sample holder includes a sensor that detects a position of the protrusion unit, and it is possible to calculate a rotational state of the holder shaft from the position of the protrusion unit detected by the sensor.

2. The sample holder according to claim 1, wherein when the holder shaft is rotated by the rotating mechanism, the protrusion unit moves inside the first through hole along the first rotation direction, and when the holder shaft is moved by the moving mechanism, the protrusion unit moves inside the second through hole along the first direction.

3. The sample holder according to claim 2, wherein inside the first through hole, when the protrusion unit is located in a communicating location between the first through hole and the second through hole, the protrusion unit is movable inside the second through hole along the first direction together with the movement of the holder shaft by the moving mechanism.

4. The sample holder according to claim 3, further comprising:

a rotary shaft member that extends in a third direction intersecting the first direction and is fixed to the placement unit, wherein the placement unit has a first plane in which the sample is placed and is rotatable in a second rotation direction with a center of the rotary shaft member in a cross-sectional view perpendicular to the third direction as a rotation axis, and when the protrusion unit moves inside the second through hole along the first direction, the first plane is parallel to a plane configured by the first direction and the third direction.

5. An analysis system comprising:

the sample holder according to claim 1;

a sample preparation device; and a sample observation device, wherein the sample holder further includes a storage unit in which the placement unit is storable, the sample preparation device includes a first sample chamber, an ion source emitting an ion beam, and a sample preparation means, and the sample observation device includes a second sample chamber, an electron source emitting an electron beam, and a sample observation means, wherein the sample preparation means includes (a) a step of moving the holder shaft in the first direction and inserting the sample holder into the first sample chamber in a state in which the placement unit is positioned outside the storage unit, (b) a step of placing the sample on the placement unit, after the step (a), (c) a step of irradiating the sample with the ion beam and processing a part of the sample, after the step (b), (d) a step of moving the holder shaft in the first direction and storing the placement unit inside the storage unit, after the step (c), and (e) a step of removing the sample holder to an outside of the first sample chamber, after the step (d), and the sample observation means includes (f) a step of inserting the sample holder into the second sample chamber in a state in which the sample processed in the sample preparation device is placed on the placement unit and the placement unit is stored inside the storage unit, (g) a step of moving the holder shaft in the first direction and moving the placement unit to the outside of the storage unit, after the step (f), and (h) a step of irradiating the sample with the electron beam and observing the sample, after the step (g).

* * * * *